(12) United States Patent
Yun

(10) Patent No.: US 10,692,579 B2
(45) Date of Patent: Jun. 23, 2020

(54) MEMORY CONTROLLER AND OPERATING METHOD THEREOF

(71) Applicant: SK hynix Inc., Gyeonggi-do (KR)

(72) Inventor: Ho Jung Yun, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/101,038

(22) Filed: Aug. 10, 2018

(65) Prior Publication Data

US 2019/0189223 A1 Jun. 20, 2019

(30) Foreign Application Priority Data

Dec. 20, 2017 (KR) .................. 10-2017-0176583

(51) Int. Cl.
| | |
|---|---|
| *G11C 16/26* | (2006.01) |
| *G11C 16/10* | (2006.01) |
| *G11C 11/56* | (2006.01) |
| *G11C 16/34* | (2006.01) |
| *G11C 29/36* | (2006.01) |
| *G11C 11/4093* | (2006.01) |
| *G11C 7/10* | (2006.01) |
| *G11C 16/04* | (2006.01) |

(52) U.S. Cl.
CPC .......... *G11C 16/26* (2013.01); *G11C 7/1006* (2013.01); *G11C 11/4093* (2013.01); *G11C 11/5628* (2013.01); *G11C 11/5642* (2013.01); *G11C 16/10* (2013.01); *G11C 16/3404* (2013.01); *G11C 29/36* (2013.01); *G11C 16/0483* (2013.01); *G11C 2211/5646* (2013.01)

(58) Field of Classification Search
CPC ................ G11C 16/10; G11C 16/26

USPC ....................... 365/185.03, 185.24
See application file for complete search history.

(56) References Cited

U.S. PATENT DOCUMENTS

| | | | | |
|---|---|---|---|---|
| 4,718,041 | A * | 1/1988 | Baglee ............. | G11C 16/10 365/185.09 |
| 5,768,630 | A * | 6/1998 | Kim ................ | G06F 13/385 710/33 |
| 6,121,982 | A * | 9/2000 | Morimoto ........ | G06K 15/1223 347/131 |
| 7,002,941 | B1 * | 2/2006 | Treadaway ....... | H04W 28/06 370/338 |
| 7,366,860 | B2 * | 4/2008 | Mito ............... | G11C 7/22 365/189.07 |
| 8,314,968 | B2 * | 11/2012 | Mori .............. | H04N 1/4056 347/43 |

(Continued)

FOREIGN PATENT DOCUMENTS

| | | |
|---|---|---|
| KR | 10-2012-0107336 | 10/2012 |
| KR | 10-2015-0054528 | 5/2015 |

(Continued)

OTHER PUBLICATIONS

Office Action issued by the USPTO for U.S. Appl. No. 15/962,460 dated Apr. 17, 2020.

*Primary Examiner* — Michael T Tran
(74) *Attorney, Agent, or Firm* — IP & T Group LLP

(57) ABSTRACT

A memory controller controls an operation of a semiconductor memory device including a plurality of memory cells at a request of a host. The memory controller includes a data conversion unit. The data conversion unit converts first data from the host by comparing the first data with second data programmed previously.

20 Claims, 17 Drawing Sheets

(56) References Cited

U.S. PATENT DOCUMENTS

| | | | |
|---|---|---|---|
| 8,543,876 B1* | 9/2013 | Wright | G01R 31/31857 |
| | | | 714/728 |
| 8,856,428 B2 | 10/2014 | Lee et al. | |
| 9,898,341 B2* | 2/2018 | Chang | G06F 9/5038 |
| 9,910,616 B2* | 3/2018 | Gopi | G06F 16/90335 |
| 9,928,167 B2* | 3/2018 | Hashimoto | G06F 12/0246 |
| 10,126,986 B2* | 11/2018 | Jung | G06F 3/0613 |
| 10,372,948 B2 | 8/2019 | Lin et al. | |
| 10,536,520 B2* | 1/2020 | Sorenson, III | H04L 67/28 |
| 10,545,849 B2* | 1/2020 | Salameh | H04W 4/70 |
| 10,546,735 B2* | 1/2020 | Strubel | G01N 33/6848 |
| 2004/0230867 A1* | 11/2004 | Soheili | G06F 11/3664 |
| | | | 714/25 |
| 2005/0007811 A1* | 1/2005 | Hyoudou | G11B 27/329 |
| | | | 365/145 |
| 2008/0080353 A1* | 4/2008 | Yamawaki | G11B 20/1426 |
| | | | 369/100 |
| 2008/0195832 A1* | 8/2008 | Takada | G06F 3/0611 |
| | | | 711/171 |
| 2009/0225597 A1* | 9/2009 | Shin | G11C 7/1006 |
| | | | 365/185.05 |
| 2011/0156934 A1* | 6/2011 | Bae | H03K 19/00346 |
| | | | 341/58 |
| 2011/0302475 A1* | 12/2011 | Eisenhuth | G06F 11/1012 |
| | | | 714/763 |
| 2012/0089877 A1* | 4/2012 | Takeuchi | G06F 3/0613 |
| | | | 714/719 |
| 2012/0163605 A1 | 6/2012 | Sharon et al. | |
| 2012/0166708 A1 | 6/2012 | Chung et al. | |
| 2012/0221775 A1 | 8/2012 | Kim et al. | |
| 2012/0246395 A1 | 9/2012 | Cho et al. | |
| 2012/0260034 A1* | 10/2012 | Primadani | G06F 11/1076 |
| | | | 711/113 |
| 2013/0121090 A1 | 5/2013 | Park et al. | |
| 2013/0163332 A1* | 6/2013 | Cha | G11C 16/10 |
| | | | 365/185.12 |
| 2013/0227213 A1 | 8/2013 | Choi et al. | |
| 2013/0339637 A1* | 12/2013 | Ishii | G06F 9/3004 |
| | | | 711/155 |
| 2014/0108716 A1* | 4/2014 | Bae | G11C 7/1006 |
| | | | 711/105 |
| 2014/0115234 A1 | 4/2014 | Woo et al. | |
| 2014/0126285 A1 | 5/2014 | Kang | |
| 2014/0281250 A1* | 9/2014 | Manohar | G06F 12/128 |
| | | | 711/133 |
| 2014/0310534 A1* | 10/2014 | Gurgi | G06F 12/1408 |
| | | | 713/193 |
| 2014/0372714 A1 | 12/2014 | Lee et al. | |
| 2015/0131374 A1 | 5/2015 | Hong | |
| 2015/0154067 A1 | 6/2015 | Rho | |
| 2015/0193163 A1 | 7/2015 | Mun et al. | |
| 2016/0291898 A1* | 10/2016 | Beitler | G06F 3/0643 |
| 2017/0060482 A1* | 3/2017 | Hara | G11C 16/10 |
| 2017/0090764 A1 | 3/2017 | Lien | |
| 2017/0195328 A1* | 7/2017 | Chitti | H04L 63/0471 |
| 2017/0337951 A1* | 11/2017 | Hollis | G11C 5/04 |
| 2018/0143871 A1* | 5/2018 | Shinbashi | H03M 13/095 |
| 2018/0315484 A1* | 11/2018 | Ye | G11C 16/08 |
| 2019/0138455 A1* | 5/2019 | Shin | G06F 12/1009 |
| 2019/0189223 A1 | 6/2019 | Yun | |

FOREIGN PATENT DOCUMENTS

| | | |
|---|---|---|
| KR | 101678915 | 11/2016 |
| KR | 101736337 | 5/2017 |

* cited by examiner

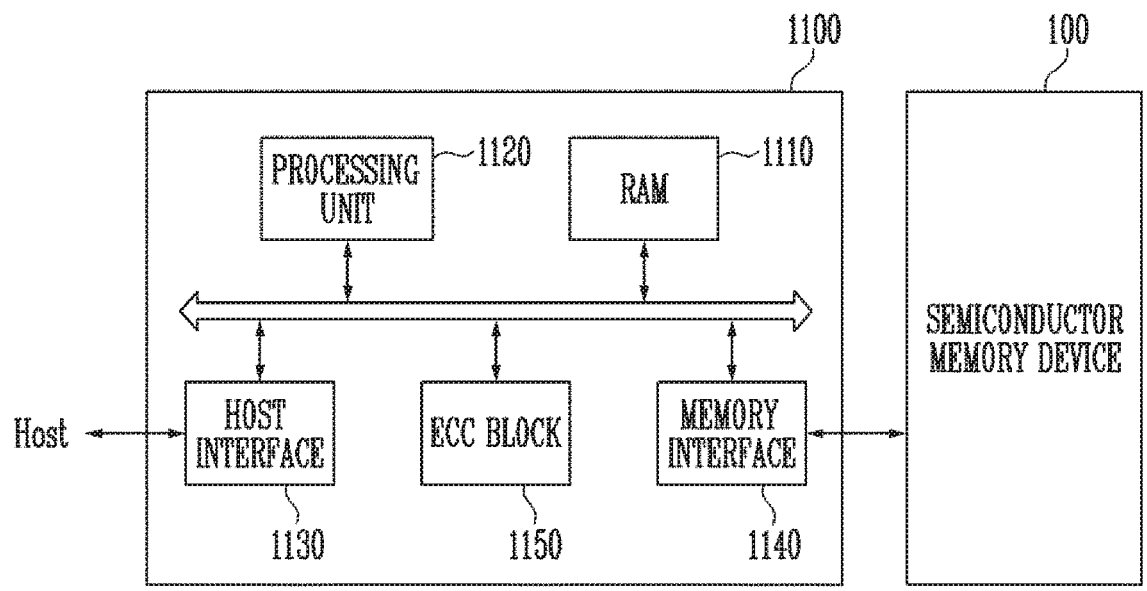

US 10,692,579 B2

MEMORY CONTROLLER AND OPERATING METHOD THEREOF

CROSS-REFERENCE TO RELATED APPLICATION

The present application claims priority under 35 U.S.C. § 119(a) to Korean patent application number 10-2017-0176583, filed on Dec. 20, 2017, which is incorporated herein by reference in its entirety.

BACKGROUND

Field of the Invention

Various embodiments of the present invention relate generally to an electronic device, and, more particularly, to a memory controller and an operating method thereof.

Description of Related Art

Generally, a semiconductor memory device (also referred to hereinafter simply as a memory device) may have a two-dimensional structure in which strings are arranged in a horizontal direction to a semiconductor substrate, or a three-dimensional structure in which strings are arranged in a vertical direction to the semiconductor device. A three-dimensional memory device was devised to overcome the limited degree of Integration of two-dimensional devices, and may include a plurality of memory cells vertically stacked on a semiconductor substrate. A memory controller may control operations of a semiconductor memory device at the request from a host.

SUMMARY

Various embodiments of the invention are directed to a memory controller for a memory device having improved performance, a memory system comprising the same, and an operating method thereof.

In accordance with an embodiment, a memory controller controlling an operation of a semiconductor memory device including a plurality of memory cells at a request of a host may include a data conversion unit, wherein the data conversion unit converts first data from the host by comparing the first data with second data programmed previously.

The second data may be programmed into a second physical page located adjacent to a first physical page to be programmed with the first data.

The data conversion unit may include a first converter generating random data by randomizing the first data, and a second converter generating conversion data by comparing the random data with the second data.

The second converter may include a reference data buffer storing the second data, a conversion determiner determining whether to convert the random data by comparing the second data with the random data, and a conversion operator generating the conversion data by processing the random data based on a determination result of the conversion determiner.

The conversion determiner may include an XOR operation unit performing an exclusive OR (XOR) operation of the second data and the random data to generate XOR operation data, and a result comparison unit determining whether to convert the random data based on a number of zero bits included in the XOR operation data.

The result comparison unit may determine to convert the random data when the number of zero bits included in the XOR operation data is greater than a predetermined threshold value, and the result comparison unit may determine not to convert the random data when the number of zero bits included in the XOR operation data is equal to or less than the predetermined threshold value.

The conversion operator may include a data inversion unit inverting the random data to generate intermediate data based on a determination result of the result comparison unit, and a flag padding unit generating the conversion data by adding a flag bit to the intermediate data.

The data inversion unit may include an inverter inverting the random data to output inverted random data, and a multiplexer receiving the random data and the inverted random data and outputting one of the random data and the inverted random data as the intermediate data based on the determination result of the result comparison unit.

In accordance with an embodiment, a memory controller controlling an operation of a semiconductor memory device including a plurality of memory cells at a request of a host may include a data conversion unit, wherein the data conversion unit generates second data by recovering first data from the semiconductor memory device based on a flag bit included in the first data.

The data conversion unit may include a first converter generating random data based on the flag bit of the first data, and a second converter generating the second data by derandomizing the random data.

The first converter may include a data division unit dividing the first data to generate the flag bit and intermediate data, an inversion determination unit determining whether to invert the intermediate data based on a value of the flag bit, and a data recovery unit generating the random data from the intermediate data based on a determination result of the inversion determination unit.

The inversion determination unit may determine to invert the intermediate data when the flag bit has a first bit value, and the inversion determination unit may determine to maintain the intermediate data when the flag bit has a second bit value.

The data recovery unit may include an inverter inverting the intermediate data to output inverted intermediate data, and a multiplexer receiving the intermediate data and the inverted intermediate data and outputting one of the intermediate data and the inverted intermediate data as the random data based on the determination result of the inversion determination unit.

In accordance with an embodiment, a method of operating a memory controller controlling a semiconductor memory device may include receiving first data from a host, determining whether to invert the first data by comparing the first data with second data previously programmed into the semiconductor memory device, and converting the first data based on a determination result.

The first data may be completely randomized, and the second data may be programmed into a second physical page adjacent to a first physical page to be programmed with the first data.

The determining of whether to invert the first data may include performing an exclusive OR (XOR) operation of the first data and the second data to generate XOR operation data, comparing a number of zero bits included in the XOR operation data with a predetermined threshold value, and converting the first data based on a comparison result.

The converting of the first data based on the comparison result may include determining to invert the first data when the number of zero bits included in the XOR operation data is greater than the predetermined threshold value, and determining to maintain the first data when the number of zero bits included in the XOR operation data is equal to or less than the predetermined threshold value.

The converting of the first data when the number of zero bits included in the XOR operation data may be greater than the predetermined threshold value may include performing an inverting operation of the first data, and padding the first data with a first bit value.

The converting of the first data when the number of zero bits included in the XOR operation data may be equal to or less than the predetermined threshold value may include padding the first data with a second bit value.

In accordance with an embodiment, a method of operating a memory controller controlling a semiconductor memory device may include receiving first data from the semiconductor memory device, referring to a flag bit in the first data, and generating second data by converting the first data based on the flag bit.

The converting of the first data based on the flag bit may include generating the second data by inverting data except for the flag bit in the first data when the flag bit is a first bit value, and generating the data except for the flag bit in the first data as second data when the flag bit is a second bit value different from the first bit value.

The method may further include derandomizing the second data after generating the second data.

In accordance with an embodiment, a memory system includes a memory device and a controller. The memory device includes a memory cell array coupled to word lines and bit lines respectively in row and column directions. The controller is configured to: generate randomized data by randomizing original data; generate currently converted data by selectively inverting the randomized data based on bit-similarity between the randomized data and previously converted data stored in the memory cell array coupled to one or more adjacent word lines; generate a flag bit indicating the currently converted data as one between inverted and non-inverted versions of the randomized data; and control the memory device to store the currently converted data and the flag bit into the memory cell array on a word line basis.

The controller may be further configured to: control the memory device to read-out the currently converted data and the flag bit from the memory cell array on the word line basis; recover the randomized data by selectively inverting the read-out converted data according to the flag bit; and recover the original data by derandomizing the recovered randomized data.

BRIEF DESCRIPTION OF THE DRAWINGS

FIG. 21 is a block diagram illustrating an embodiment of a memory system shown in FIG. 1;

FIG. 22 is a block diagram illustrating an application embodiment of a memory system shown in FIG. 20.

DETAILED DESCRIPTION

Figure 1:
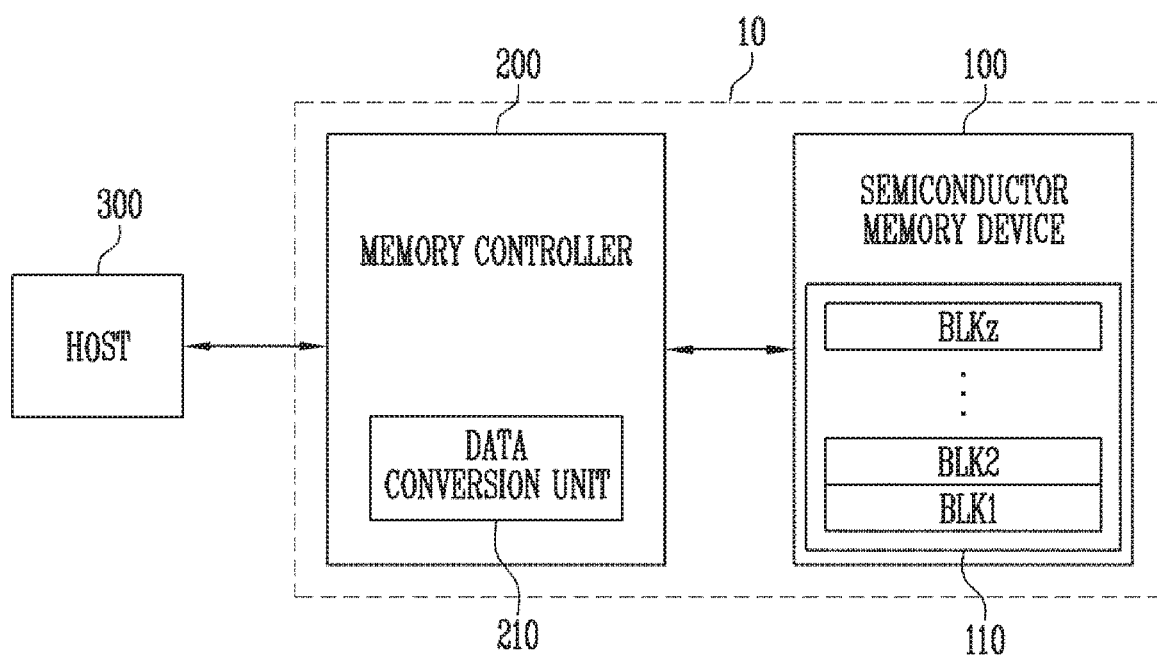
FIG. 1 is a block diagram illustrating a memory controller, a semiconductor memory device, and a memory system including the same in accordance with an embodiment of the invention.

Example embodiments of the invention will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the example embodiments to those skilled in the art.

It will be understood that when an element is referred to as being "coupled" or "connected" to a certain element, it may be directly coupled or connected to the certain element or may be indirectly coupled or connected to the certain element, with intervening elements being present therebetween. In the specification, when an element is referred to as "comprising" or "including" a component, it does not exclude other components but may further include other components as well.

Hereinafter, exemplary embodiments of the present disclosure will be described in detail with reference to the accompanying drawings in order for those skilled in the art to be able to readily implement the technical spirit of the present disclosure. Moreover, detailed descriptions related to well-known functions or configurations will be left out to avoid unnecessarily obscuring the subject matter of the present invention. In the drawings, like reference numerals refer to like elements throughout.

FIG. 1 is a block diagram illustrating a memory controller 200, a semiconductor memory device 100, and a memory system 10 including the same in accordance with an embodiment of the invention.

Referring to FIG. 1, the memory system 10 may Include the semiconductor memory device 100 and the memory controller 200. The semiconductor memory device 100 may include a memory cell array 110.

The memory cell array 110 may include a plurality of memory areas. Each of the memory areas may be a plurality of memory blocks BLK1 to BLKz as shown in FIG. 1. Each memory block may serve as an erase unit. Each of the plurality of memory blocks BLK1 to BLKz may include a plurality of memory cells.

The semiconductor memory device 100 may be controlled by the memory controller 200.

The semiconductor memory device 100 may write data into the memory cell array 110 in response to a write request from the memory controller 200. When receiving a write command, an address, and data at the write request, the semiconductor memory device 100 may write the data into memory cells indicated by the address.

The semiconductor memory device 100 may perform a read operation in response to a read request from the memory controller 200. When receiving a read command and an address at the read request from the memory controller 200, the semiconductor memory device 100 may read data of memory cells indicated by the address and output the read data to the memory controller 200.

In accordance with an embodiment, the semiconductor memory device 100 may be a flash memory device. However, the invention is not limited thereto. In accordance with an embodiment, the memory device 100 may be a Double Data Rate Synchronous Dynamic Random-access Memory (DDR SDRAM), a Low Power Double Data Rate4 (LPDDR4) SDRAM, a Graphics Double Data Rate (GDDR) SDRAM, Low Power DDR (LPDDR), a Rambus Dynamic Random-access Memory (RDRAM), a NAND flash memory, a vertical NAND, a NOR flash memory, a resistive random-access memory (RRAM), a phase-change memory (PRAM), a magnetoresistive random-access memory (MRAM), a ferroelectric random-access memory (FRAM), or a spin transfer torque random-access memory (STT-RAM).

In accordance with an embodiment, the memory device 100 may have a three-dimensional array structure. The present disclosure may also be applied not only to a flash memory in which a charge storage layer includes a conductive floating gate (FG), but also to a charge trap flash (CTF) memory in which a charge storage layer includes an insulating layer.

The memory controller 200 may be coupled between the semiconductor memory device 100 and a host 300. The memory controller 200 may be configured to interface the host 300 and the semiconductor memory device 100. The host 300 may control the memory controller 200 to transfer a write request or a read request to the semiconductor memory device 100.

The memory controller 200 may include a data conversion unit 210. The data conversion unit 210 may convert data transferred from the host 300 and transfer the converted data to the semiconductor memory device 100. More specifically, the data conversion unit 210 may Include a randomizer (not illustrated), and the randomizer may randomize the received data. Data distribution characteristics in a row direction may be improved by the randomizer.

More specifically, the randomizer may be activated during a write operation. When a block address of a memory block for writing data is provided to the randomizer (hereinafter referred to also as a target memory block), the randomizer may generate a randomizing seed corresponding to the target memory block. In other words, the randomizer may be configured to generate a randomizing seed corresponding to the target memory block, among randomizing seeds corresponding to the plurality of memory blocks BLK1 to BLKz. The randomizer may generate randomized data through an operation of the received data from the host 300 and the generated randomizing seed. The randomized data may have improved distribution characteristics in the row direction.

In general, the generated randomized data may be written into the target memory block of the semiconductor memory device. As widely known, since the data operated based on the randomizing seed is written to the memory cell array 110, a threshold voltage distribution of the memory cells in the memory cell array 110 may be improved and reliability of data stored in the memory cells may be improved. However, the above-described general randomizing method improves the distribution characteristics only in the row direction, but not in a column direction.

The data conversion unit 210 of the memory controller 200 in accordance with an embodiment of the invention may convert the randomized data (hereinafter, 'random data') to generate 'conversion data' having improved distribution characteristics in the column direction. The data conversion unit 210 may include a flag bit in the conversion data. The memory controller 200 may transfer the generated conversion data to the semiconductor memory device 100. Therefore, a threshold voltage distribution of the memory cells in the memory cell array 110 may be further improved, and reliability of the data stored in the memory cells may be further improved.

During a read operation, the data conversion unit 210 may receive the 'conversion data' stored in the semiconductor memory device 100. As described above, the conversion data may have improved distribution characteristics in the column direction as well as the row direction. The data conversion unit 210 may inversely convert the conversion data to generate random data. The conversion data may be inversely converted into the random data by referring to the flag bit which was included in the conversion data when the conversion data was written into the memory device 100. The flag bit will be described below with reference to FIGS. 10A and 10B. As described above, the random data may refer to data randomized using a randomizing seed.

A derandomizer (not shown) in the data conversion unit 210 may be activated. A derandomizing seed corresponding to a read target memory block may be generated. In other words, when a block address of the read target memory block is provided to the derandomizer, the derandomizer may generate the derandomizing seed corresponding to the target memory block. In other words, the derandomizer may be configured to generate the derandomizing seed corresponding to the read target memory block, among derandomizing seeds corresponding to the plurality of memory blocks BLK1 to BLKz.

The derandomizer may perform an operation on the random data and employ the generated derandomizing seed to derandomize the random data into the original data. By the above operation, the derandomized original data may be transferred to the host 300.

As described above, the memory controller 200 in accordance with an embodiment of the invention may not only improve distribution characteristics in the row direction by randomizing data to be stored in the semiconductor memory device 100 but also may generate conversion data having improved distribution characteristics in the column direction by further converting the randomized data. Therefore, a threshold voltage distribution of the memory cells in the memory cell array 110 may be improved, and reliability of the data stored in the memory cells may be improved.

Figure 2:
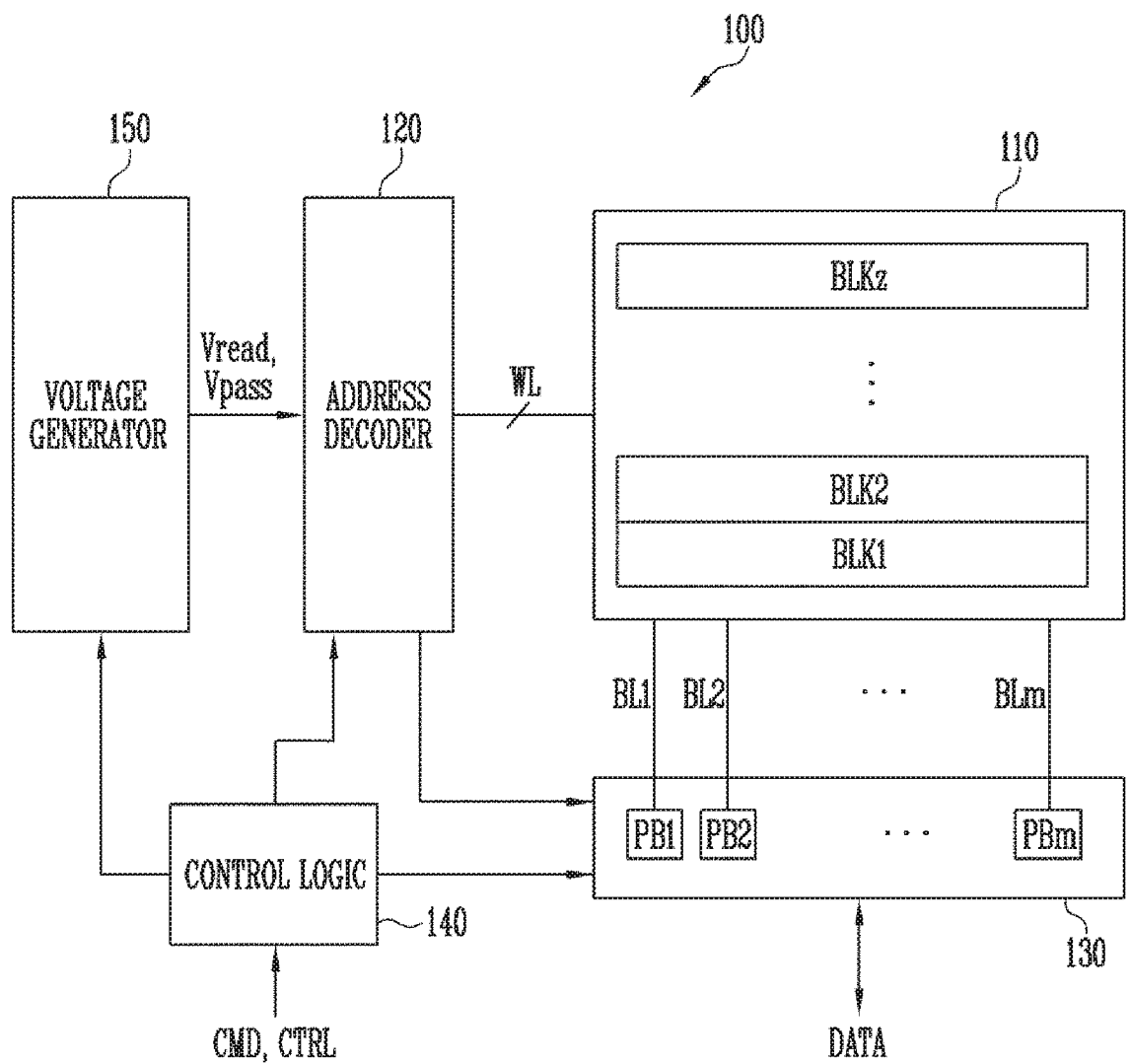
FIG. 2 is a block diagram illustrating an exemplary configuration of the semiconductor memory device shown in FIG. 1.

FIG. 2 is a block diagram illustrating the semiconductor memory device 100 shown in FIG. 1.

Referring to FIG. 2, the semiconductor memory device 100 may include the memory cell array 110, an address decoder 120, a read and write circuit 130, a control logic 140, and a voltage generator 150.

The memory cell array 110 may include the plurality of memory blocks BLK1 to BLKz. The plurality of memory blocks BLK1 to BLKz may be coupled to the address decoder 120 through word lines WL. The plurality of memory blocks BLK1 to BLKz may be coupled to the read and write circuit 130 through bit lines BL1 to BLm. Each of the plurality of memory blocks BLK1 to BLKz may include a plurality of memory cells. In accordance with an embodiment, the plurality of memory cells may be non-volatile memory cells having a vertical channel structure. The memory cell array 110 may have a two-dimensional structure. In accordance with an embodiment, the memory cell array 110 may have a three-dimensional structure. Each of the plurality of memory cells included in the memory cell array 110 may store data of at least one bit. In accordance with an embodiment, each of the plurality of memory cells included in the memory cell array 110 may be a single-level cell (SLC) storing 1-bit data. In accordance with an embodiment, each of the plurality of memory cells included in the memory cell array 110 may be a multi-level cell (MLC) storing 2-bit data. In accordance with an embodiment, each of the plurality of memory cells included in the memory cell array 110 may be a triple-level cell (TLC) storing 3-bit data. In accordance with an embodiment, each of the plurality of memory cells included in the memory cell array 110 may be a quad-level cell (QLC) storing 4-bit data. In accordance with an embodiment, each of the plurality of memory cells included in the memory cell array 110 may store 5 or more bits of data.

The address decoder 120, the read and write circuit 130, and the control logic 150 may operate as a peripheral circuit driving the memory cell array 110. The address decoder 120 may be coupled to the memory cell array 110 through the word lines WL. The address decoder 120 may be controlled by the control logic 140. The address decoder 120 may receive an address through an input/output buffer (not illustrated) in the semiconductor memory device 100.

The address decoder 120 may be configured to decode a block address of the received address. The address decoder 120 may select at least one memory block according to the decoded block address. In addition, during a read operation, the address decoder 120 may apply a read voltage Vread generated by the voltage generator 150 to a selected word line of the selected memory block and a pass voltage Vpass to unselected word lines. In addition, during a program verify operation, a verify voltage generated by the voltage generator 150 may be applied to the selected word line of the selected memory block and the pass voltage Vpass may be applied to the unselected word lines.

The address decoder 120 may be configured to decode a column address of the received address. The address decoder 120 may transfer the decoded column address to the read and write circuit 130.

A read operation and a program operation of the semiconductor memory device 100 may be performed in units of pages. An address received at the request for a read operation and a program operation may include a block address, a row address, and a column address. The address decoder 120 may select one memory block and one-word line in response to the block address and the row address. The column address may be decoded by the address decoder 120 and provided to the read and write circuit 130.

The address decoder 120 may include a block decoder, a row decoder, a column decoder, and an address buffer.

The read and write circuit 130 may include a plurality of page buffers PB1 to PBm. The read and write circuit 130 may operate as a read circuit during a read operation of the memory cell array 110 and a write circuit during a write operation thereof. The page buffers PB1 to PBm may be coupled to the memory cell array 110 through the bit lines BL1 to BLm. The page buffers PB1 to PBm may continuously supply a sensing current to bit lines coupled to memory cells in order to sense threshold voltages of memory cells and sense changes in amount of current caused by program states of memory cells corresponding thereto through a sensing node to latch sensing data during a read operation and a program verify operation. The read and write circuit 130 may operate in response to page buffer control signals output from the control logic 140.

The read and write circuit 130 may sense data of a memory cell, temporarily store the read data, and output data DATA to the input/output buffer (not illustrated) of the semiconductor memory device 100 during a read operation. In accordance with an exemplary embodiment, the read and write circuit 130 may include a column selection circuit in addition to the page buffers PB1 to PBm (or page registers).

The control logic 140 may be coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may be configured to control general operations of the semiconductor memory device 100 in response to the control signal CTRL. In addition, the control logic 140 may output a control signal to control sensing node precharge potential levels of the page buffers PB1 to PBm. The control logic 140 may control the read and write circuit 130 to perform a read operation of the memory cell array 110.

The voltage generator 150 may generate the read voltage Vread and the pass voltage Vpass in response to a control signal output from the control logic 140 during a read operation. The voltage generator 150 may include a plurality of pumping capacitors receiving an Internal power voltage to generate a plurality of voltages having various voltage levels, and may generate a plurality of voltages by selectively activating the plurality of pumping capacitors in response to control of the control logic 140.

The address decoder 120, the read and write circuit 130, and the voltage generator 150 may function as a 'peripheral circuit' configured to perform a read operation, a write operation, and an erase operation on the memory cell array 110. The control logic 140 may control the peripheral circuit to perform the read operation, the write operation, and the erase operation on the memory cell array 110.

Figure 3:
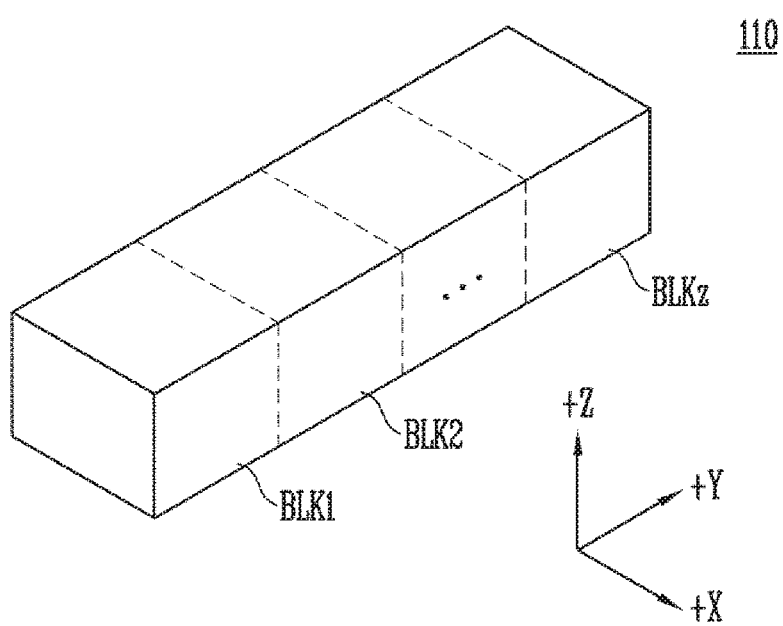
FIG. 3 shows an embodiment of a memory cell array shown in FIG. 2.

FIG. 3 shows an embodiment of the memory cell array 110 shown in FIG. 2.

Referring to FIG. 3, the memory cell array 110 may include a plurality of memory blocks BLK1 to BLKz. Each of the memory blocks may include a three-dimensional structure. Each memory block may include a plurality of memory cells stacked on a substrate. The plurality of memory cells may be arranged in +X direction, +Y direction and +Z direction. The structure of each memory block will be described in detail below with reference to FIGS. 4 and 5.

Figure 4:
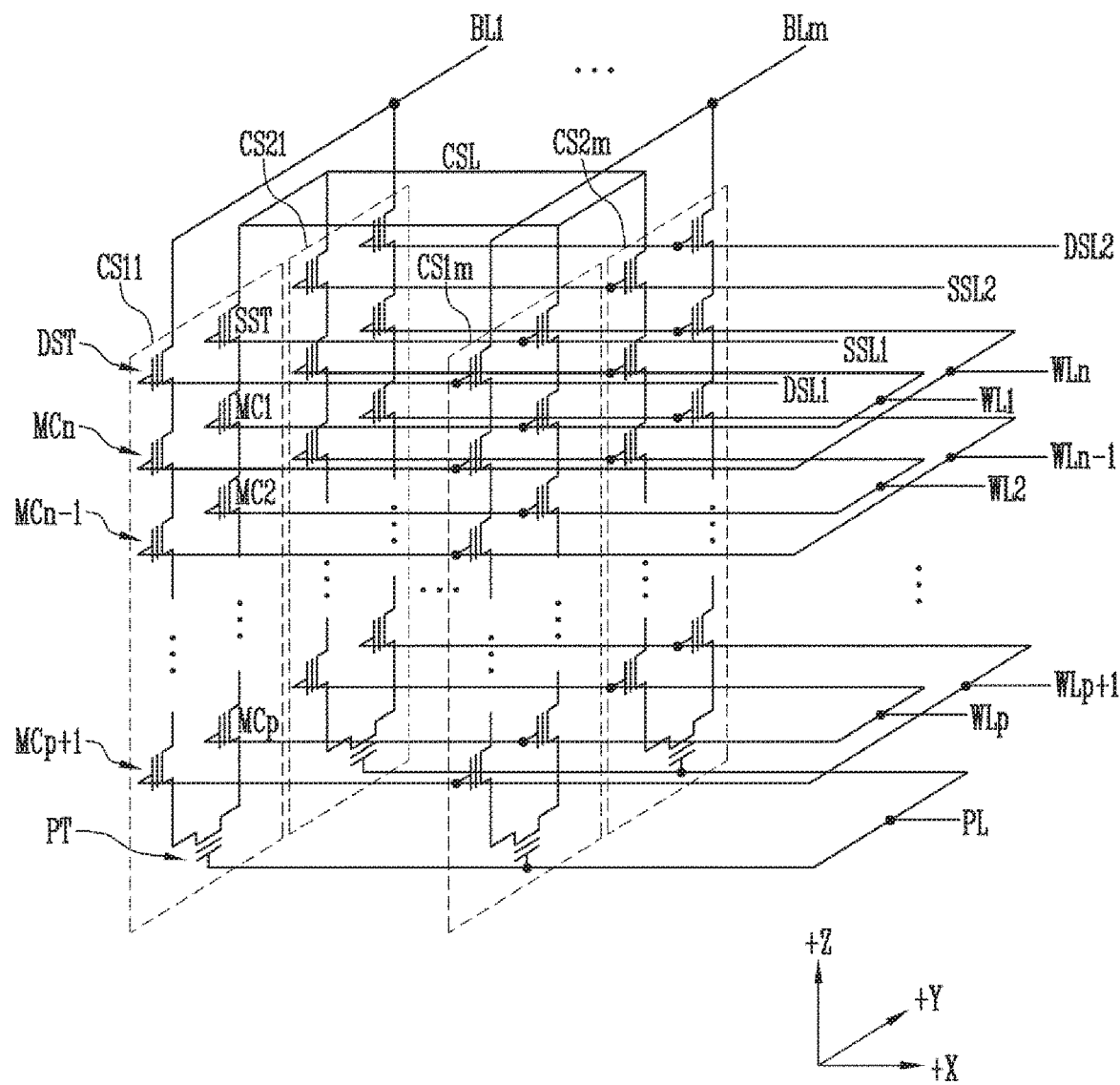
FIG. 4 is a circuit diagram illustrating an embodiment of a memory block BLKa which is one of the memory blocks BLK1 to BLKz shown in FIG. 3.

FIG. 4 is a circuit diagram illustrating one (BLKa) of the memory blocks BLK1 to BLKz shown in FIG. 3.

Referring to FIG. 4, the memory block BLKa may include a plurality of cell strings CS11 to CS1m and CS21 to CS2m. In accordance with an embodiment, each of the cell strings CS11 to CS1m and CS21 to CS2m may be formed in a 'U' shape. In the memory block BLKa, m cell strings may be arranged in a row direction (i.e., +X direction). As illustrated in FIG. 4, two cell strings are arranged in a column direction (i.e., a +Y direction) for convenience of explanation. However, it is understood that three or more cell strings may be arranged in the column direction.

Each of the cell strings CS11 to CS1m and CS21 to CS2m may include at least one source select transistor SST, first to nth memory cells MC1 to MCn, a pipe transistor PT, and at least one drain select transistor DST.

Each of the select transistors SST and DST and each of the memory cells MC1 to MCn may have similar structures to each other. In accordance with an embodiment, each of the select transistors SST and DST and the memory cells MC1 to MCn may include a channel layer, a tunneling insulating layer, a charge storage layer, and a blocking insulating layer. In an embodiment, a pillar for providing a channel layer may be provided in each cell string. In accordance with an embodiment, a pillar for providing at least one of the channel layer, the tunneling insulating layer, the charge storage layer, and the blocking insulating layer may be provided to each cell string.

The source select transistor SST of each cell string may be coupled between the common source line CSL and the memory cells MC1 to MCp.

In accordance with an embodiment, source select transistors of cell strings arranged on the same row may be coupled to a source select line extending in the row direction, and source select transistors of cell strings arranged on different rows are coupled to different source select lines. In FIG. 4, source select transistors of the cell strings CS11 to CS1m in the first row may be coupled to a first source selection line SSL1. Source select transistors of the cell strings CS21 to CS2m in the second row may be coupled to a second source selection line SSL2.

In accordance with an embodiment, the source select transistors of the cell strings CS11 to CS1m and CS21 to CS2m may be coupled in common to one source selection line.

The first to nth memory cells MC1 to MCn of each cell string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to the +Z direction and coupled in series between the source select transistor SST and the pipe transistor PT. The (p+1)th to nth memory cells MCp+1 to MCn may be sequentially arranged in +Z direction and coupled in series between the pipe transistor PT and the drain select transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to first to nth word lines WL1 to WLn, respectively.

The gate of the pipe transistor PT of each cell string may be coupled to a pipe line PL.

The drain select transistor DST of each cell string may be coupled between the corresponding bit line and the memory cells MCp+1 to MCn. Cell strings arranged in the row direction may be coupled to a drain selection line extending in the row direction. Drain select transistors of the cell strings CS11 to CS1m in the first row may be coupled to a first drain selection line DSL1. Drain select transistors of the cell strings CS21 to CS2m in the second row may be coupled to a second drain selection line DSL2.

Cell strings arranged in the column direction may be coupled to a bit line extending in the column direction. As illustrated in FIG. 3, the cell strings CS11 and CS21 in the first column may be coupled to the first bit line BL1. The cell strings CS1m and CS2m in an mth column may be coupled to an mth bit line BLm.

Memory cells coupled to the same word line in the cell strings arranged in the row direction may form a single page. For example, memory cells coupled to the first word line WL1 in the cell strings CS11 to CS1m in the first row may constitute a single page. Memory cells coupled to the first word line WL1 in the cell strings CS21 to CS2m in the second row may constitute another page. When one of the drain selection lines DSL1 and DSL2 is selected, cell strings arranged in one row direction may be selected. When one of the first to nth word lines WL1 to WLn is selected, one page may be selected from selected cell strings.

In accordance with an embodiment, even bit lines and odd bit lines may replace the first to mth bit lines BL1 to BLm. In addition, even cell strings of the cell strings CS11 to CS1m or CS21 to CS2m arranged in the row direction may be coupled to even bit lines, respectively, and odd cell strings of the cell strings CS11 to CS1m or CS21 to CS2m arranged in the row direction may be coupled to odd bit lines, respectively.

In accordance with an embodiment, at least one of the first to nth memory cells MC1 to MCn may serve as a dummy memory cell. For example, at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When more dummy memory cells are provided, the operational reliability of the memory block BLKa may increase, whereas the size of the memory block BLKa may increase. On the other hand, when the number of dummy memory cells decreases, the size of the memory block BLKa may be reduced, and the operational reliability of the memory block BLKa may be reduced.

In order to efficiently control one or more dummy memory cells, each of the dummy memory cells may have a required threshold voltage. Before or after an erase operation on the memory block BLKa, program operations may be performed on a portion or entirety of the dummy memory cells. When an erase operation is performed after the program operation has been performed, by controlling voltages applied to the dummy word lines coupled to the respective dummy memory cells, the dummy memory cells may have required threshold voltages.

Figure 5:
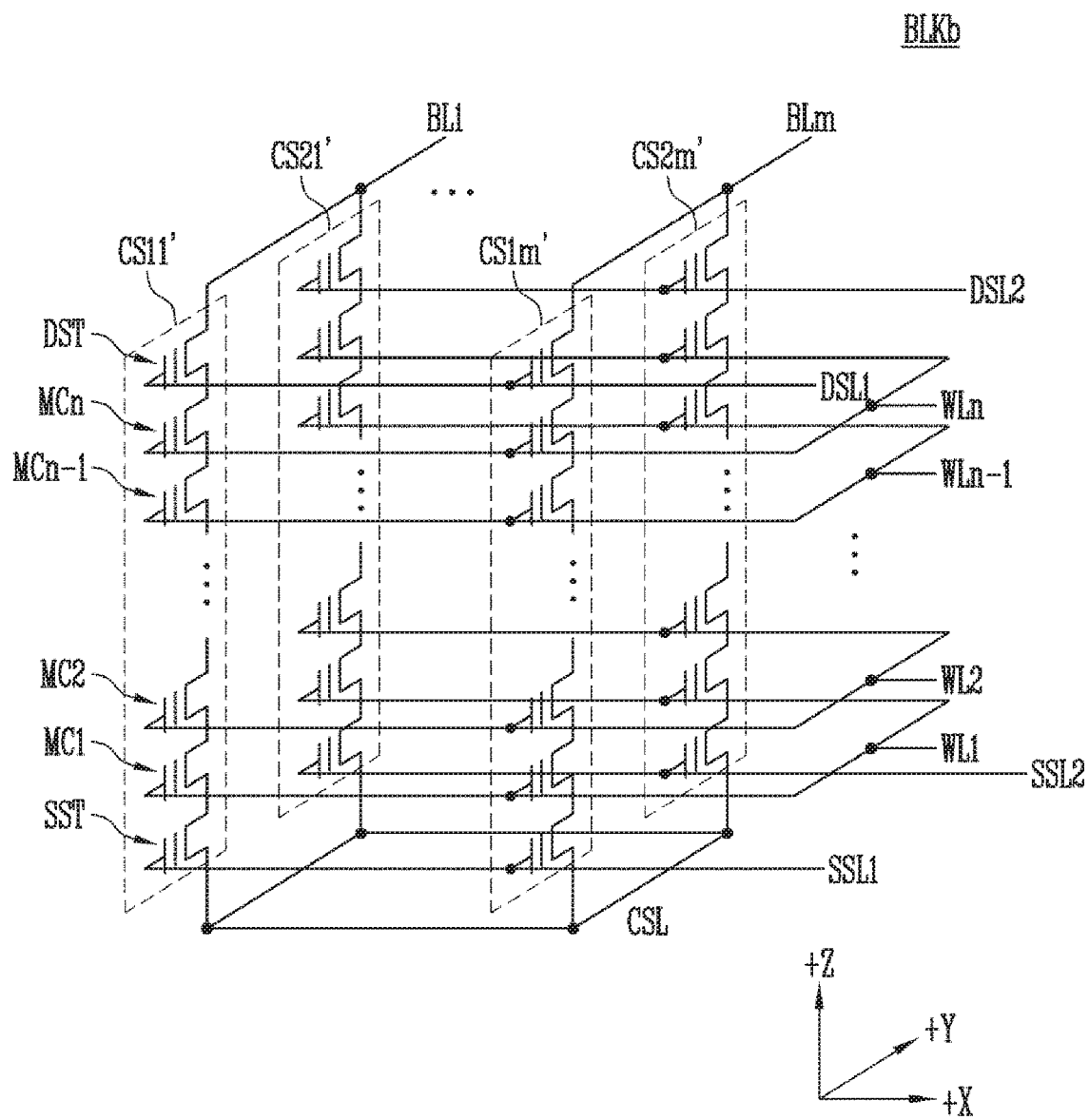
FIG. 5 is a circuit diagram illustrating an embodiment of a memory block BLKb which is one of the memory blocks BLK1 to BLKz shown in FIG. 3.

FIG. 5 is a circuit diagram illustrating an embodiment of the memory block BLKb, among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' may extend in the +Z direction. Each of the plurality of cell strings CS11' to CS1m' and CS21' to CS2m' may include at least one source select transistor SST, the first to nth memory cells MC1 to MCn, and at least one drain select transistor DST, which are stacked on a substrate (not shown) under a memory block BLK1'.

The source select transistor SST of each cell string may be coupled between the common source line CSL and the first to nth memory cells MC1 to MCn. Source select transistors of cell strings arranged in the same row may be coupled to the same source selection line. Source select transistors of the cell strings CS11' to CS1m' arranged in the first row may be coupled to the first source selection line SSL1. Source select transistors of the cell strings CS21' to CS2m' arranged in the second row may be coupled to the second source select line SSL2. In accordance with an embodiment, the source select transistors of the cell strings CS11' to CS1m' and CS21' to CS2m' may be coupled in common to a single source selection line.

The first to nth memory cells MC1 to MCn of each cell string may be coupled in series between the source select transistor SST and the drain select transistor DST. Gates of the first to nth memory cells MC1 to MCn may be coupled to the first to nth word lines WL1 to WLn, respectively.

The drain select transistor DST of each cell string may be coupled between the corresponding bit line and the memory cells MC1 to MCn. Drain select transistors of cell strings arranged in the row direction may be coupled to a drain selection line extending in the row direction. Drain select transistors of the cell strings CS11' to CS1m' in the first row may be coupled to the first drain selection line DSL1. The drain select transistors of the cell strings CS21' to CS2m' in the second row may be coupled to the second drain select line DSL2.

As a result, the memory block BLKb shown in FIG. 5 may have a similar equivalent circuit to the memory block BLKa shown in FIG. 4 except that the pipe transistor PT is removed from each cell string of the memory block BLKb.

In accordance with an embodiment, even bit lines and odd bit lines may replace the first to mth bit lines BL1 to BLm. In addition, even cell strings of the cell strings CS11' to CS1m' or CS21' to CS2m' arranged in the row direction may be coupled to the even bit lines, respectively, and odd cell strings of the cell strings CS11' to CS1m' or CS21' to CS2m' arranged in the row direction may be coupled to the odd bit lines, respectively.

In accordance with an embodiment, at least one of the first to nth memory cells MC1 to MCn may serve as a dummy memory cell. For example, one or more dummy memory cells may be provided to reduce an electric field between the source select transistor SST and the first to nth memory cells MC1 to MCn. Alternatively, one or more dummy memory cells may be provided to reduce an electric field between the drain select transistor DST and the memory cells MC1 to MCn. When more dummy memory cells are provided, the operational reliability of the memory block BLKb may increase, whereas the size of the memory block BLKb may increase. On the other hand, when the number of dummy memory cells decreases, the size of the memory block BLKb may be reduced, and the operational reliability of the memory block BLKb may be reduced.

In order to efficiently control one or more dummy memory cells, each of the dummy memory cells may have a required threshold voltage. Before or after an erase operation on the memory block BLKb, program operations may be performed on a portion or entirety of the dummy memory cells. When an erase operation is performed after the program operation has been performed, threshold voltages of the dummy memory cells may control the voltages applied to the dummy word lines coupled to the respective dummy memory cells, so that the dummy memory cells may have required threshold voltages.

Figure 6:
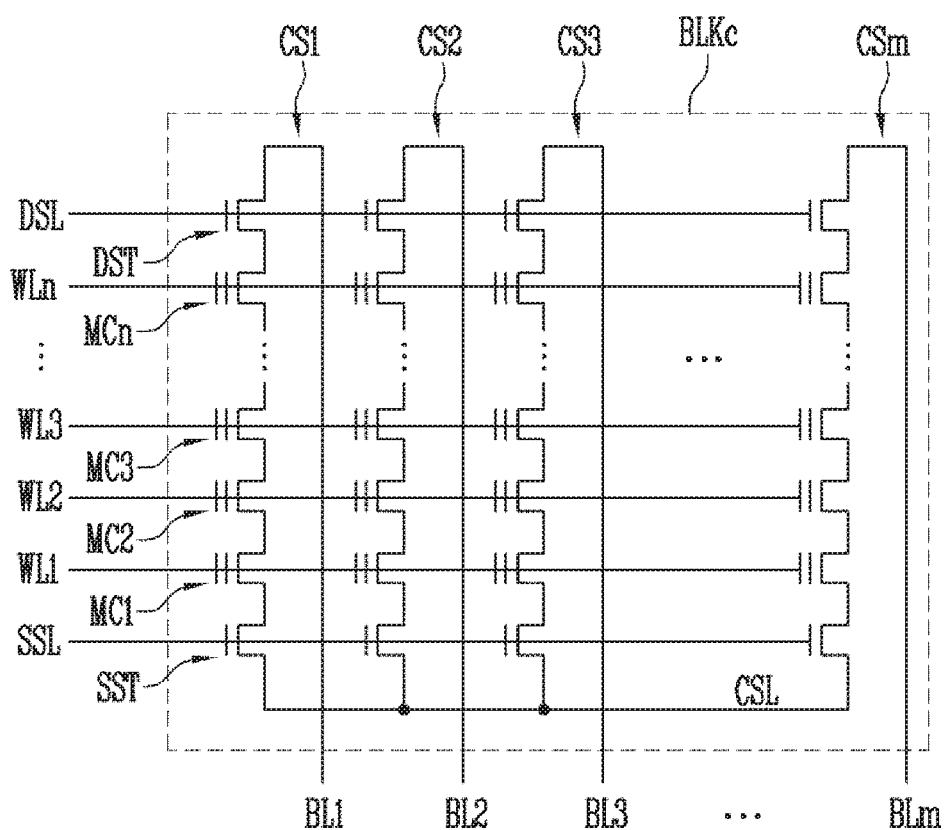
FIG. 6 is a circuit diagram illustrating an embodiment of a memory block BLKc which is one of the memory blocks BLK1 to BLKz included in a memory cell array shown in FIG. 2.

FIG. 6 is a circuit diagram illustrating an embodiment of a memory block BLKc which is one of the memory blocks BLK1 to BLKz included in the memory cell array 110 shown in FIG. 2.

Referring to FIG. 6, the memory block BLKc may include the plurality of cell strings CS1 to CSm. The plurality of cell strings CS1 to CSm may be coupled to the plurality of bit lines BL1 to BLm, respectively. Each of the cell strings CS1 to CSm may include at least one source select transistor SST, the first to nth memory cells MC1 to MCn, and at least one drain select transistor DST.

Each of the select transistors SST and DST and each of the memory cells MC1 to MCn may have similar structures to each other. In accordance with an embodiment, each of the select transistors SST and DST and the memory cells MC1 to MCn may include a channel layer, a tunneling insulating layer, a charge storage layer, and a blocking insulating layer. In accordance with an embodiment, a pillar for providing the channel layer may be provided in each cell string. In accordance with an embodiment, a pillar for providing at least one of the channel layer, the tunneling insulating layer, the charge storage layer, and the blocking insulating layer may be provided to each cell string.

The source select transistor SST of each cell string may be coupled between the common source line CSL and the first to nth memory cells MC1 to MCn.

The first to nth memory cells MC1 to MCn of each cell string may be coupled between the source select transistor SST and the drain select transistor DST.

The drain select transistor DST of each cell string may be coupled between a corresponding bit line and the memory cells MC1 to MCn.

Memory cells coupled to the same word line may form a single page. When the drain selection line DSL is selected, the cell strings CS1 to CSm may be selected. When one of the word lines WL1 to WLn is selected, one page may be selected from selected cell strings.

In accordance with an embodiment, even bit lines and odd bit lines may replace the first to mth bit lines BL1 to BLm. Even cell strings of the cell strings CS1 to CSm may be coupled to the even bit lines, respectively, and odd cell strings thereof may be coupled to the odd bit lines, respectively.

Figure 7:
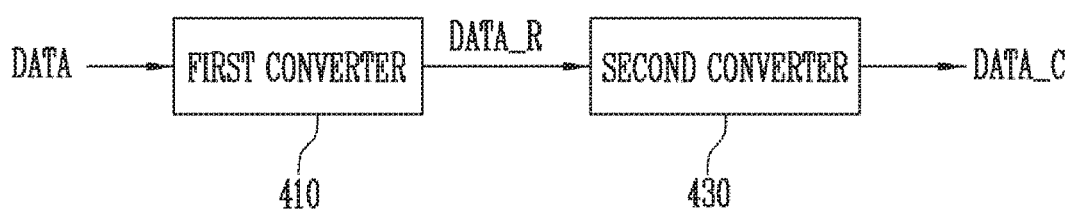
FIG. 7 is a block diagram illustrating an example of a data conversion unit of a memory controller in accordance with an embodiment of the invention.

FIG. 7 is a block diagram illustrating an example of the data conversion unit 210 of the memory controller 200, in accordance with an embodiment of the invention.

Referring to FIG. 7, the memory controller 200 in accordance with an embodiment of the invention may include a first converter 410 and a second converter 430. The first and second converters 410 and 430 may constitute the data conversion unit 210 of the controller 210.

In accordance with an embodiment, the data conversion unit 210 may further include a third converter 610 and a fourth converter 630 as described later with reference to FIGS. 16 to 20.

The first converter 410 may convert the data DATA transferred from the host 300 and generate random data DATA_R. The first converter 410 may be configured as the randomizer as described above. The first converter 410 may generate a randomizing seed. In addition, the first converter 410 may perform an operation of the data DATA received from the host 300 and employ the randomizing seed to generate the random data DATA_R. Therefore, the random data DATA_R may have improved distribution characteristics in the row direction. Since the first converter 410 is a randomizer further detailed description thereof will be omitted. The first converter 410 may be any suitable randomizer. The first converter 410 may be part of the data converter 210 or alternatively may be separate from the data converter 210.

For example, the random data DATA_R may be stored in memory cells coupled to a third word line WL3 of the memory block BLKc as illustrated in FIG. 6. The row direction may refer to a word line direction of FIG. 6. The random data DATA_R stored in the memory cells coupled to the third word line WL3 may have improved distribution characteristics in the row direction i.e., the word line WL3 direction. However, the random data DATA_R do not consider the distribution characteristics with respect to the data stored in a neighboring word line, e.g., word line WL2 which is adjacent to the third word line WL3. However, this type of randomization, which considers randomization in the row direction only, may result in some cases in deteriorated overall distribution characteristics for the data stored in the memory cells coupled to adjacent word lines, such as in the above example, the second and third word lines WL2 and WL3, because the data stored in the memory cells coupled to the third word line WL3 may have similar distribution characteristics to the data stored in the memory cells coupled to the second word line WL2. In accordance with an embodiment of the invention, this problem is addressed by providing memory controller 200 which may further convert the random data DATA_R to generate conversion data with improved distribution characteristics both in the row and the column directions of the memory cell array 110.

The second converter 430 may convert the random data DATA_R to generate conversion data DATA_C. The conversion data DATA_C may be generated by comparing distribution characteristics between a physical page in which the random data DATA_R is stored and an adjacent physical page. For example, the conversion data DATA_C may be generated by comparing the random data DATA_R corresponding to the third word line WL3 with the data previously stored in the second word line WL2. Therefore, the distribution characteristics of the conversion data DATA_C may be improved in both row and column directions. Therefore, a threshold voltage distribution of the memory cells in the memory cell array 110 may be further improved, and reliability of the data stored in the memory cells may be further improved.

A detailed description of the second converter 430 shown in FIG. 7 will be described below with reference to FIGS. 8 to 11.

Figure 8:
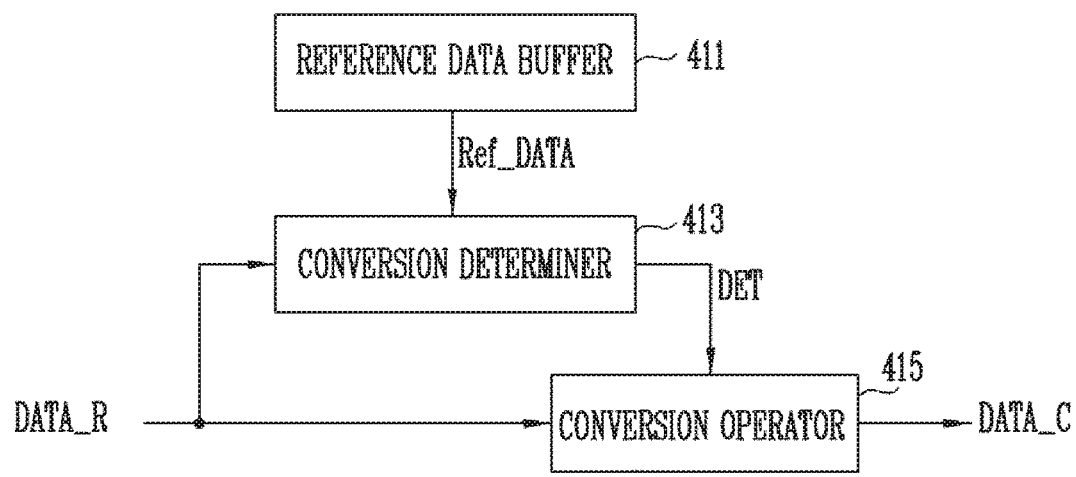
FIG. 8 is a block diagram illustrating an exemplary embodiment of a second converter of FIG. 7.

FIG. 8 is a block diagram illustrating an exemplary embodiment of the second converter 430 of FIG. 7. Referring to FIG. 8, the second converter 430 may include a reference data buffer 411, a conversion determiner 413, and a conversion operator 415.

The reference data buffer 411 may store reference data Ref_DATA. The reference data Ref_DATA may correspond to data of a previous physical page which is compared with the random data DATA_R. For example, the random data DATA_R may be stored in a physical page coupled to the third word line WL3 shown in FIG. 6 and the reference data may be data previously stored in a physical page coupled to the second word line WL2.

For example, when data converted by the data conversion unit 210 is stored in the physical page coupled to the second word line WL2, the previously stored conversion data of the physical page coupled to the second word line WL2 may also be temporarily stored as the reference data Ref_DATA in the reference data buffer 411. The temporarily stored reference data Ref_DATA may be used to convert current random data DATA_R to be stored in the physical page coupled to the third word line WL3. The reference data Ref_DATA may be updated each time the conversion data DATA_C is written into the semiconductor memory device 100.

The conversion determiner 413 may receive the random data DATA_R. The random data DATA_R may refer to data converted by the first converter 410. The conversion determiner 413 may receive the reference data Ref_DATA from the reference data buffer 411. The conversion determiner 413 may compare the random data DATA_R with the reference data Ref_DATA to perform an operation thereof to generate a determination result DET indicating whether or not to convert the random data DATA_R. The conversion determiner 413 may generate the determination result DET based on the similarity between the random data DATA_R and the reference data Ref_DATA. For example, the conversion determiner 413 may generate the determination result DET based on the number of same bits between bits of the random data DATA_R and bits of the reference data Ref_DATA. The generated determination result DET may indicate whether or not to convert the random data DATA_R. For example, the determination result DET may be data indicating whether or not to invert the random data DATA_R. An exemplary embodiment of the conversion determiner 413 will be described below with reference to FIGS. 9A and 9B.

The conversion operator 415 may receive the random data DATA_R and the determination result DET. The conversion operator 415 may generate the conversion data DATA_C from the random data DATA_R in response to the determination result DET. For example, the conversion data DATA_C may be the random data DATA_R or the inverted random data DATA_R. An exemplary embodiment of the conversion determiner 415 will be described below with reference to FIGS. 10A and 10B.

Figures 9A, 9B:
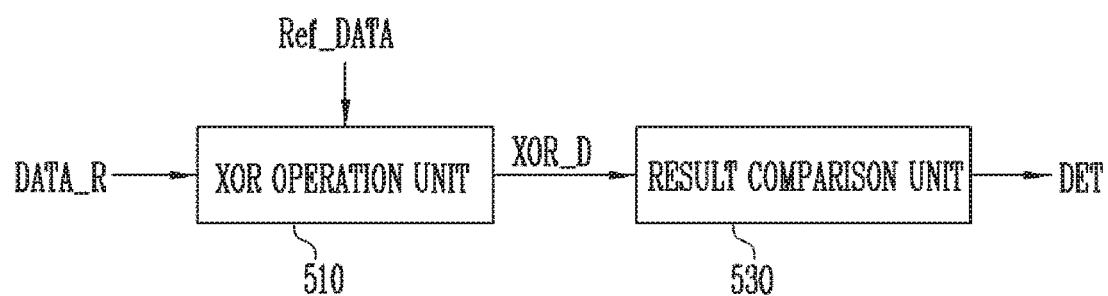
FIG. 9A is a block diagram illustrating an exemplary embodiment of a conversion determiner shown in FIG. 8.
FIG. 9B is a diagram schematically illustrating a conversion determination operation performed by a conversion determiner.

FIG. 9A is a block diagram illustrating an exemplary embodiment of the conversion determiner 413 shown in FIG. 8. FIG. 9B is a diagram schematically illustrating a conversion determination operation by the conversion determiner 413. Hereinafter, operations of the conversion determiner 413 will be described with reference to FIGS. 9A and 9B.

Referring to FIG. 9A, the conversion determiner 413 may include an XOR operation unit 510 and a result comparison unit 530.

The XOR operation unit 510 may perform an exclusive-OR (XOR) operation of the random data DATA_R and the reference data Ref_DATA to generate XOR operation data XOR_D. The generated XOR operation data XOR_D may be transferred to the result comparison unit 530.

The result comparison unit 530 may compare the number of zeros included in the XOR operation data XOR_D with a predetermined threshold value Ref_N to determine whether or not the random data DATA_R need to be converted, to generate the determination result DET which indicates whether or not the conversion data DATA_DATA_R need to be converted, and to transmit the determination result DET to the conversion operator 415.

FIG. 9B shows operation examples of the conversion determiner 413 for two cases. In the first case (CASE I), the reference data Ref_DATA may be "01010001" and the random data DATA_R may be "11010101". In the first case, the random data DATA_R "11010101" may be data converted by the first converter 410 shown in FIG. 7. In addition, the reference data Ref_DATA "01010001" may be data stored in the reference data buffer 411 shown in FIG. 8. Referring to FIGS. 6 and 9B, when the random data DATA_R "01010001" is to be stored in the physical page coupled to the third word line WL3, the reference data Ref_DATA "01010001" may be previously stored in the physical page coupled to the second word line WL2. In other words, the conversion determiner 413 may determine whether the random data DATA_R need to be converted or not by comparing the random data DATA_R with the reference data Ref_DATA which are stored in a physical page coupled to an adjacent word line to the current physical page.

By the XOR operation unit 510, the XOR operation data XOR_D may be generated. More specifically, by comparing the respective bits of the reference data Ref_DATA and the random data DATA_R, data of '0' may be generated when bits at the same position are the same, and data of '1' may be generated when bits at the same position are different. More specifically, the first bit of the reference data Ref_DATA is '0' and the first bit of the random data DATA_R is '1'. Since the two bits are different the first bit of the XOR operation data XOR_D may be '1'. In addition, the second bit of the reference data Ref_DATA is '1' and the second bit of the random data DATA_R is '1'. Since the two bits are the same as each other, the second bit of the XOR operation data XOR_D may be '0'. In addition, the third bit of the reference data Ref_DATA is '0' and the third bit of the random data DATA_R is '0'. Since the two bits are the same as each other, the third bit of the XOR operation data XOR_D may be '0'. In this manner, the XOR operation data XOR_D may be generated.

When the XOR operation data XOR_D is transferred to the result comparison unit 530, the result comparison unit 530 may compare the number of zero bits included in the XOR operation data XOR_D with the predetermined threshold value Ref_N to generate the determination result DET.

For example, when the threshold value Ref_N is 5, the result comparison unit 530 may determine whether the number of zero bits included in the XOR operation data is five or more.

As for the first case (CASE I), the number of zero bits included in the XOR operation data XOR_D is six, which is greater than the threshold value Ref_N of five. Thus, the determination result DET having a value of 1 may be generated meaning that the random data DATA_R may have to be inverted since the reference data Ref_DATA and the random data DATA_R have a relatively large number of same bits. The generated determination result DET may then be transferred to the conversion operator 415.

In the second case (CASE II), the reference data Ref_DATA may be different from the reference data of the first case (CASE I). For example, in the first case (CASE I), the reference data Ref_DATA may be "01010001". In addition, in the second case (CASE II), the reference data Ref_DATA may be "00110011" and be different from the reference data of the first case (CASE I). In the second case, the random data DATA_R "11010101" may be data converted by the first converter 410 shown in FIG. 7. In addition, the reference data Ref_DATA "00110011" may be data stored in the reference data buffer 411 shown in FIG. 8. Referring to FIGS. 6 and 9B, when the random data DATA_R is to be stored in the physical page coupled to the third word line WL3, the reference data Ref_DATA may be previously stored in the physical page coupled to the second word line WL2. In other words, the conversion determiner 413 may compare the random data with the data d stored in a physical page immediately before to the current physical page.

By the XOR operation unit 510, the XOR operation data XOR_D may be generated. More specifically, by comparing respective bit positions of the reference data Ref_DATA and the random data DATA_R, data of '0' may be generated when bits at the same position are the same, and data of '1' may be generated when bits at the same position are different. More specifically, the first bit of the reference data Ref_DATA is '0' and the first bit of the random data DATA_R is '1'. Since the two bits are different from each other, the first bit of the XOR operation data XOR_D may be '1'. In addition, the second bit of the reference data Ref_DATA is '0' and the second bit of the random data DATA_R is '1'. Since the two bits are different from each other, the second bit of the XOR operation data XOR_D may be '1'. In addition, the third bit of the reference data Ref_DATA is '1' and the third bit of the random data DATA_R is '0'. Since the two bits are different from each other, the third bit of the XOR operation data XOR_D may be '1'. In this manner, the XOR operation data XOR_D may be generated.

When the XOR operation data XOR_D is transferred to the result comparison unit 530, the result comparison unit 530 may compare the number of zero bits included in the XOR operation data XOR_D with the predetermined threshold value Ref_N to generate the determination result DET.

For example, when the threshold value Ref_N is five, the result comparison unit 530 may determine whether the number of zero bits included in the XOR operation data is five or more. As for the second case (CASE II), the number of zero bits included in the XOR operation data XOR_D is three, which is less than the threshold value Ref_N of five. Thus, the determination result DET having a value of '0' may be generated meaning that the random data DATA_R may not have to be inverted since the reference data Ref_DATA and the random data DATA_R have a small number of bits which are the same as each other. The generated determination result DET may be transferred to the conversion operator 415.

As illustrated in FIG. 9B, each of the reference data Ref_DATA and the random data DATA_R may include eight bits. However, the invention is not limited thereto. The number of bits included in each of the reference data Ref_DATA and the random data DATA_R may vary by design.

Figure 10A:
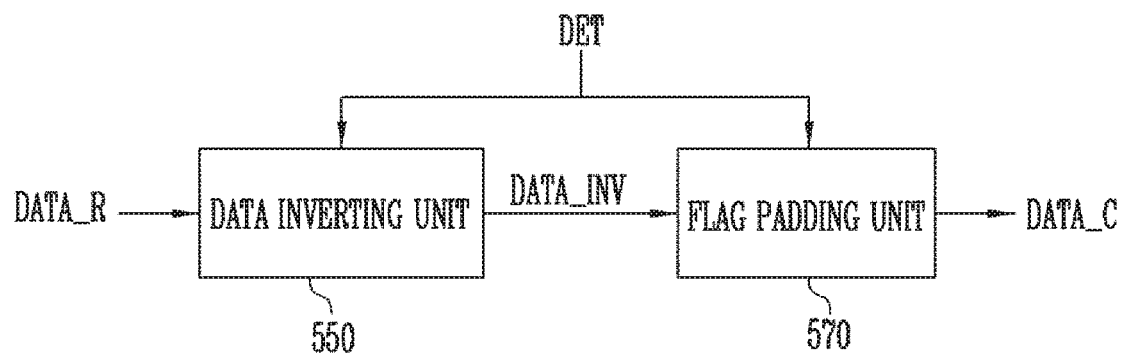
FIG. 10A is a block diagram illustrating an exemplary embodiment of a conversion operator shown in FIG. 8.
Figure 10B:
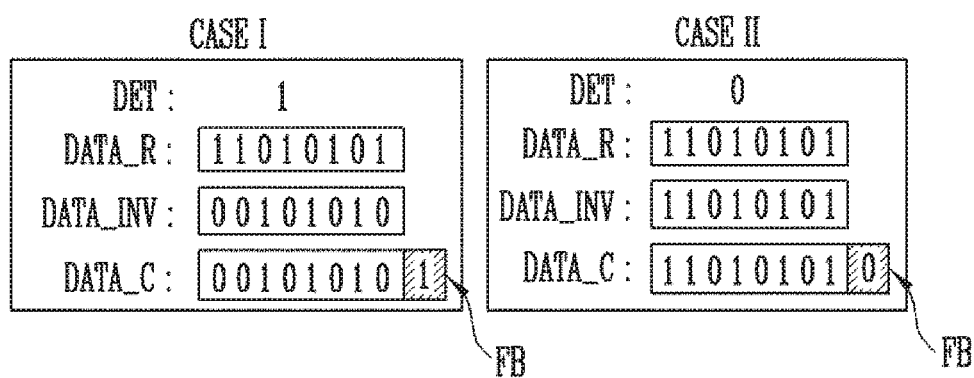
FIG. 10B is a diagram schematically illustrating a conversion determination operation performed by a conversion determiner.

FIG. 10A is a block diagram illustrating an exemplary embodiment of the conversion operator 415 shown in FIG. 8. FIG. 10B is a diagram schematically illustrating data conversion by the conversion operator 415.

The conversion operator 415 may include a data inverting unit 550 and a flag padding unit 570.

The data inverting unit 550 may receive the random data DATA_R and the determination result DET. The data inverting unit 550 may generate intermediate data DATA_INV from the random data DATA_R in response to the determination result DET. The intermediate data DATA_INV may be the random data DATA_R or inverted random data. The data inverting unit 550 may directly output the random data DATA_R, or may invert the random data DATA_R to output the inverted random data according to a value of the determination result DET. For example, when the determination result DET has a value of '1', the data inverting unit 550 may invert the random data DATA_R and output the inverted random data as the intermediate data DATA_INV. When the determination result DET has a value of '0', the data inverting unit 550 may directly output the random data DATA_R as the intermediate data DATA_INV.

The intermediate data DATA_INV may be stored in the reference data buffer 411 as the reference data Ref_DATA when a corresponding conversion data DATA_C is written into the semiconductor memory device 100 thereby updating the reference data Ref_DATA each time the conversion data DATA_C is written into the semiconductor memory device 100.

A flag padding unit 570 may receive the intermediate data DATA_INV and the determination result DET. The flag padding unit 570 may pad the intermediate data DATA_INV with a flag bit in accordance with the determination result DET and may output the padded intermediate data DATA_INV as the conversion data DATA_C. Hereinafter, operations of the data inversion unit 550 and the flag padding unit 570 are described with reference to FIG. 10B.

A first case (CASE I) of FIG. 10B may be the same as the first case (CASE I) of FIG. 9B. In the first case (CASE I), since the determination result DET is '1', the data inversion unit 550 may invert the random data DATA_R and output the inverted random data as the intermediate data DATA_INV. Since the random data DATA_R includes bits of "11010101", the intermediate data DATA_INV may include bits of "00101010".

The flag padding unit 570 may perform a padding operation so that a flag bit FB may be included in the intermediate data DATA_INV. When the determination result DET is '1', the flag bit FB may also have a bit of '1'. The flag bit FB having the value of '1' may mean that the intermediate data DATA_INV includes the inverted random data.

A second case (CASE II) of FIG. 10B is the same as the second case (CASE II) of FIG. 9B. In the second case (CASE II), since the determination result DET is '0', the data inversion unit 550 may directly output the random data DATA_R as the intermediate data DATA_INV. Since the random data DATA_R includes bits of "11010101", the intermediate data DATA_INV may include bits of "11010101".

The flag padding unit 570 may perform a padding operation so that the flag bit FB may be included in the intermediate data DATA_INV. When the determination result DET is '0', the flag bit FB may also have a value of '0'. The flag bit FB having the value of '0' may mean that the intermediate data DATA_INV includes non-inverted random data.

The flag bit FB may be used to reverse-convert the conversion data DATA_C when the conversion data DATA_C is read in a subsequent process. An operation of reverse-converting the conversion data DATA_C through the flag bit FB will be described below with reference to FIGS. 16 and 20.

Figure 11:
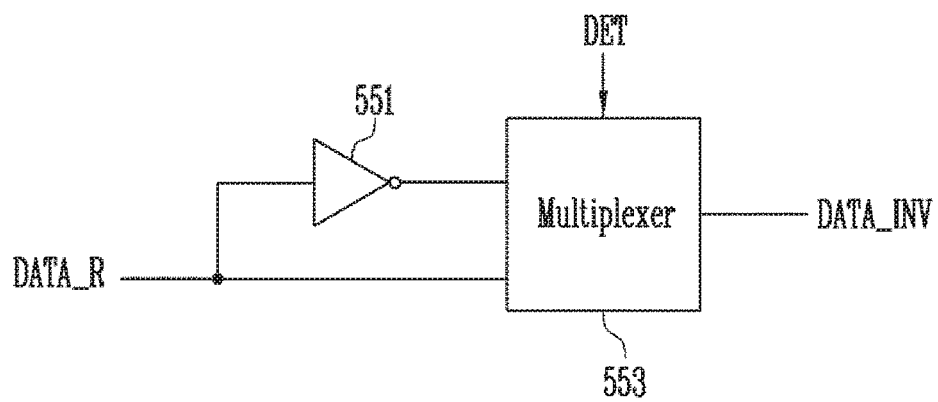
FIG. 11 is a block diagram illustrating an exemplary embodiment of a data inverting unit of FIG. 10A.

FIG. 11 is a block diagram illustrating an exemplary embodiment of the data inversion unit 550 of FIG. 10A.

Referring to FIG. 11, the data inversion unit 550 may include an inverter 551 and a multiplexer 553. The multiplexer 553 may receive the random data DATA_R and the inverted random data as an input. In addition, the multiplexer 553 may receive the determination result DET as a control signal. When the determination result DET has a value of '0', the multiplexer 553 may select and output the random data DATA_R as the intermediate data DATA_INV. When the determination result DET Is '1', the multiplexer 553 may select and output the inverted random data received from the inverter 551 as the intermediate data DATA_INV. As illustrated in FIG. 11, the data inversion unit 550 may select and output one of the random data DATA_R and the inverted random data according to the determination result DET.

Figure 12:
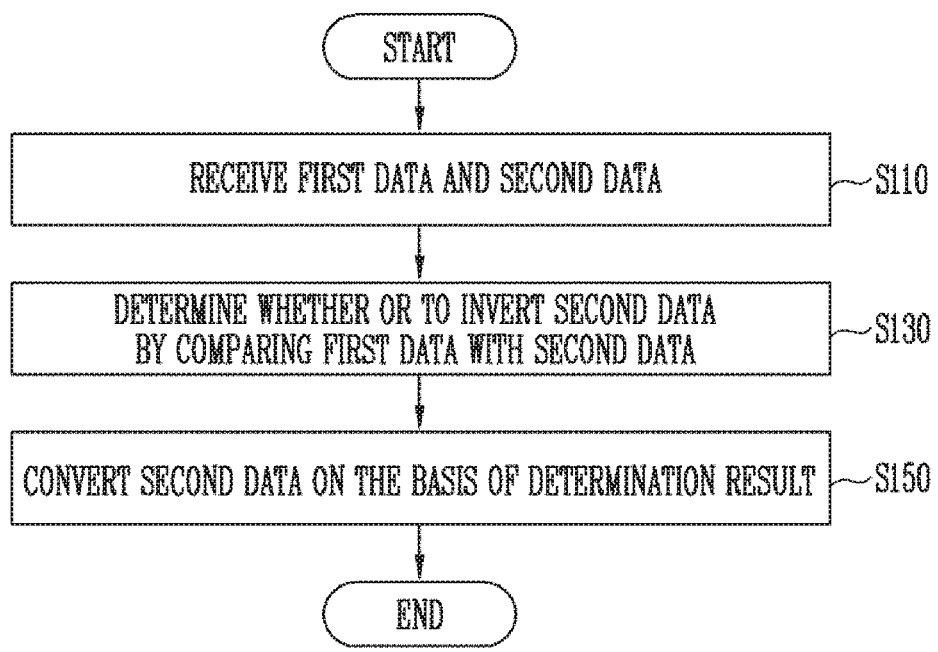
FIG. 12 is a flowchart illustrating an operating method of a memory controller in accordance with an embodiment.

FIG. 12 is a flowchart of an operating method of the memory controller 200 in accordance with an embodiment. Referring to FIG. 12, the operating method of the memory controller 200 may include receiving first data and second data at step S110, determining whether to invert the second data by comparing the first data with the second data at step S130, and converting the second data based on the determination result at step S150. Hereinafter, the operating method of FIG. 12 will be described below with reference to FIGS. 13 to 15.

Figure 13:
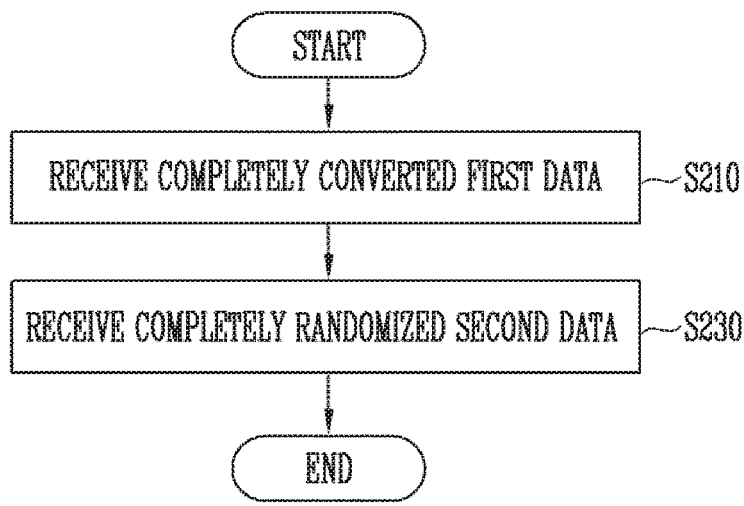
FIG. 13 is a flowchart illustrating an example of step S110 at which first and second data of FIG. 12 are received.

FIG. 13 is a flowchart illustrating an example of step S110 at which the first and second data of FIG. 12 are received. Referring to FIG. 13, receiving the first and second data at step S110 may include receiving the first data which has been completely converted at step S210 and receiving the second data which has been completely randomized at step S230.

The first data received at step S210 may refer to data which is previously programmed into an adjacent physical page. For example, the first data may be the reference data Ref_DATA or the intermediate data DATA_INV which is temporarily stored in the reference data buffer 411 of FIG. 8. As described above, the intermediate data DATA_INV may be stored in the reference data buffer 411 as the reference data Ref_DATA when a corresponding conversion data DATA_C is written into the semiconductor memory device 100 thereby updating the reference data Ref_DATA each time the conversion data DATA_C is written into the semiconductor memory device 100. The second data received at step S230 may be transferred from the host 300 and may be programmed into the semiconductor memory device 100. More specifically, the second data may be the random data DATA_R which is completely randomized by the first converter 410 of FIG. 7.

Figure 14:
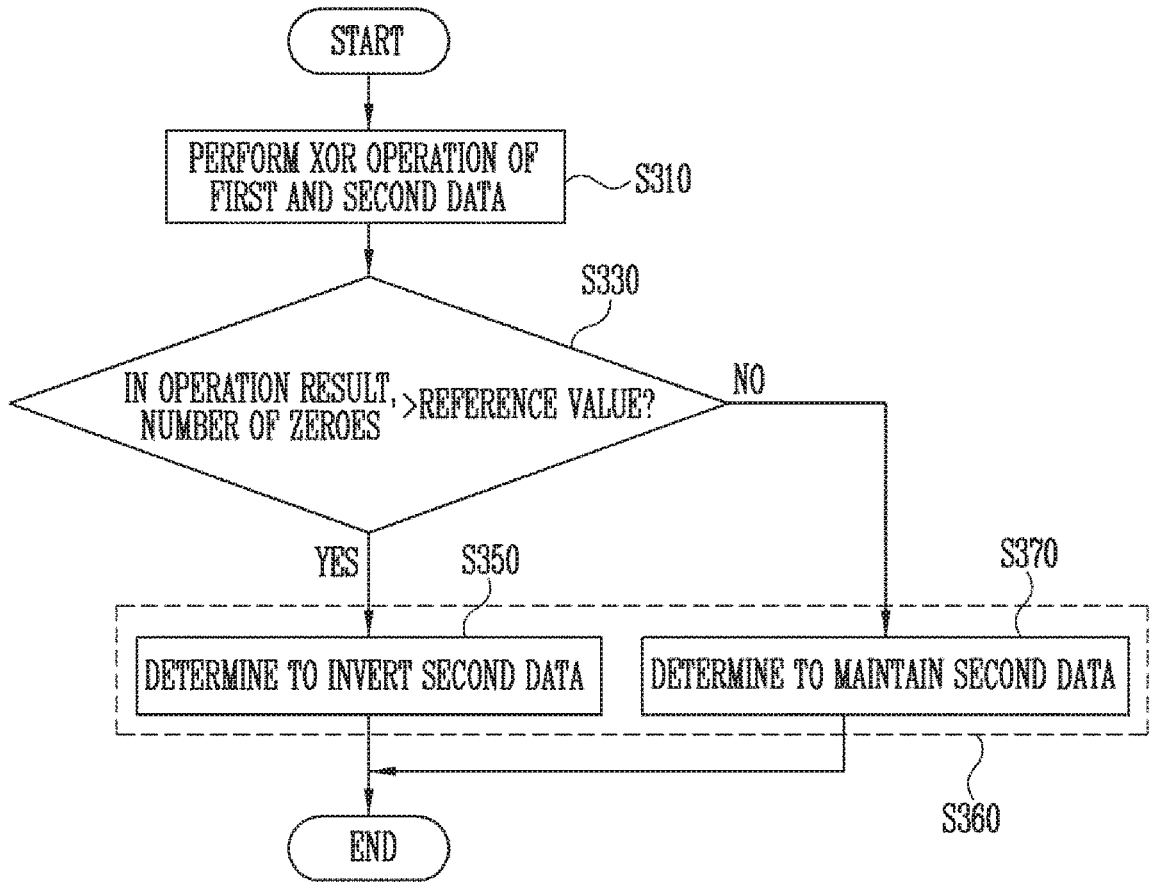
FIG. 14 is a flowchart illustrating an example of step S130 of determining whether or not to invert second data shown in FIG. 12.

FIG. 14 is a flowchart illustrating an example of step S130 at which a determination is made whether or not to invert the second data shown in FIG. 12.

Referring to FIG. 14, determining whether or not to invert the second data at step S130 may include performing an XOR operation of the first and second data at step S310, determining whether the number of zeros as a result of the XOR operation is greater than the predetermined threshold value Ref_N at step S330, and determining whether or not to invert the second data according to the determination result at step S360. Step S360 may include step S350 at which the second data is determined to be inverted and step S630 at which the second data is determined to be maintained.

At step S310, an XOR operation of the first and the second data may be performed. For example, as described above with reference to FIGS. 9A and 9B, an XOR operation of the reference data Ref_DATA and the random data DATA_R may be performed to generate the XOR operation data XOR_D. In the first case (CASE I) as exemplified in FIG. 9B, as a result of performing step S310, the XOR operation data XOR_D including bits of '10000100' may be generated. In the second case (CASE II) as exemplified in FIG. 9B, as the result of performing step S310, the XOR operation data XOR_D including bits of '11100110' may be generated.

At step S330, the number of zero bits included in the XOR operation data XOR_D may be compared with the predetermined threshold value Ref_N. For example, the threshold value Ref_N may be five. As for the first case (CASE I) as exemplified in FIG. 9B, since the number of zero bits included in the XOR operation data XOR_D is six, the process flow proceeds to step S350. As for the second case (CASE II) as exemplified in FIG. 9B, since the number of zero bits included in the XOR operation data XOR_D is three, the process flow proceeds to step S370.

At step S350, since the number of zero bits included in the XOR operation data XOR_D is greater than five, the second data is determined to be inverted. The determination result DET having a value of '1' may be generated. At step S370, since the number of zero bits included in the XOR operation data XOR_D is less than five, the second data may be determined not to be inverted. Thus, the determination result DET having a value of '0' may be generated.

Figure 15:
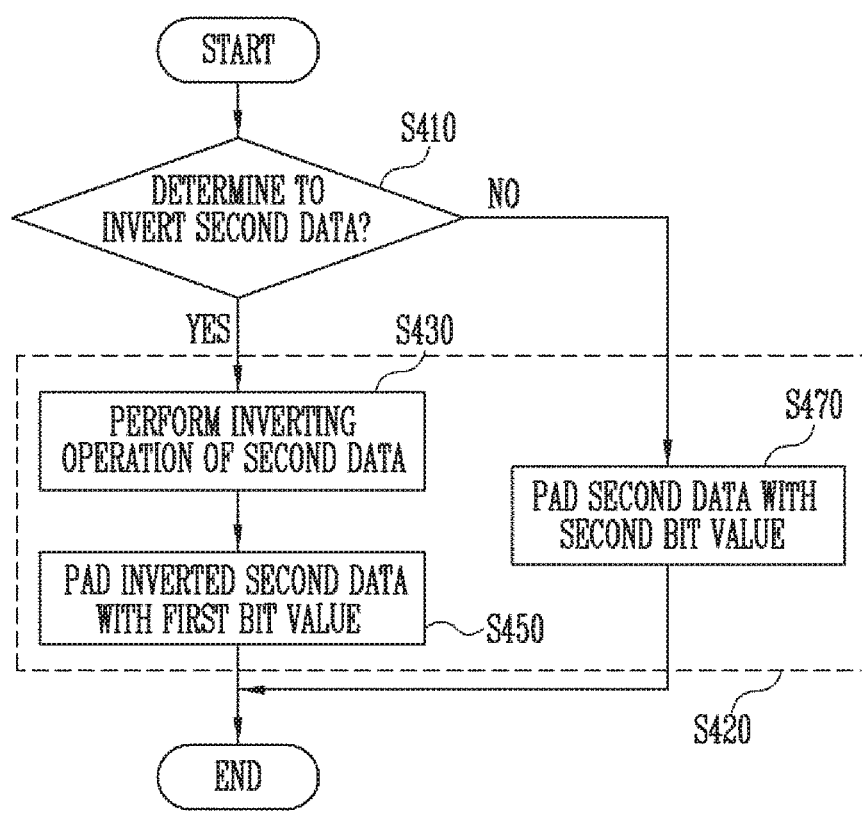
FIG. 15 is a flowchart illustrating an example of step S150 of converting second data as shown in FIG. 12.

FIG. 15 is a flowchart illustrating an example of step S150 of converting the second data shown in FIG. 12.

Referring to FIG. 15, converting the second data at step S150 includes determining whether or not to invert the second data at step S410 and generating conversion data according to the determination result at step S420. Step S420 may include performing an inverting operation of the second data when the inversion of the second data is determined at step S430, padding the inverted second data with a first bit value at step S450, and padding the second data with a second bit value when maintaining the second data is determined at step S470.

At step S410, whether to invert the second data may be determined with reference to, for example, the determination result DET. For example, when the determination result DET has a value of '1', inversion of the second data may be determined and the process flow may proceed to step S430. For example, when the determination result DET has a value of '0', the second data may be determined to be maintained without inversion, and the process flow may proceed to step S470.

At step S430, an inverting operation of the second data may be performed. As shown in the first case (CASE I) of FIG. 10B, the intermediate data DATA_INV may be generated by inverting the random data DATA_R. In addition, at step S450, the inverted second data may be padded with the first bit value. For example, the first bit value may have a value of '1'. As shown in the first case (CASE I) of FIG. 10B, the conversion data DATA_C including the bits of '010100011' may be generated.

At step S470, while the second data is maintained, the second data may be padded with a second bit value. For example, the second bit value may have a value of '0'. In this example, the conversion data DATA_C including the bits of '110101010' in which a flag bit of "0" is included in the random data DATA_R may be generated as shown in the second case (CASE II) of FIG. 10B.

Figure 16:
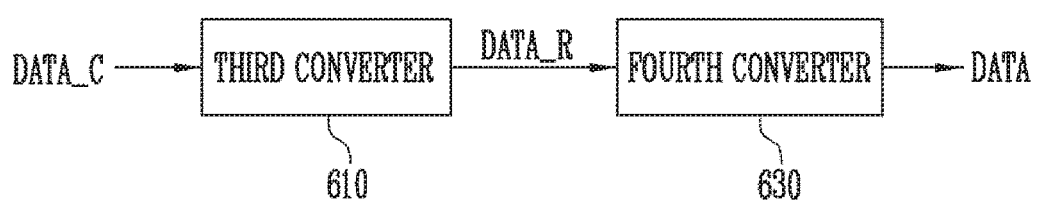
FIG. 16 is a block diagram illustrating an example of a data conversion unit of a memory controller in accordance with an embodiment of the invention.

FIG. 16 is a block diagram illustrating an example of the data conversion unit 210 of the memory controller 200 in accordance with an embodiment of the invention.

Referring to FIG. 16, the data conversion unit 210 of the memory controller 200 in accordance with an embodiment may include a third converter 610 and a fourth converter 630. In accordance with an embodiment, the data conversion unit 210 may further include the first converter 410 and the second converter 430 shown in FIG. 7.

The third converter 610 may generate the random data DATA_R by reverse-converting the conversion data DATA_C read from the semiconductor memory device 100. The conversion data DATA_C shown in FIG. 16 may be generated by the second converter 430 shown in FIG. 7 and stored in the semiconductor memory device 100.

The fourth converter 630 may generate the original data DATA by derandomizing the random data DATA_R and transfer the original data DATA to the host 300. The fourth converter 630 may be composed of a derandomizer. The fourth converter 630 may generate a derandomizing seed. In addition, the fourth converter 630 may perform an operation of the random data DATA_R from the third converter 610 and the derandomizing seed to derandomize the random data DATA_R into the original data DATA. Since the fourth converter 630 may be composed of a well-known derandomizer, a detailed description thereof will be omitted.

Figure 17A:
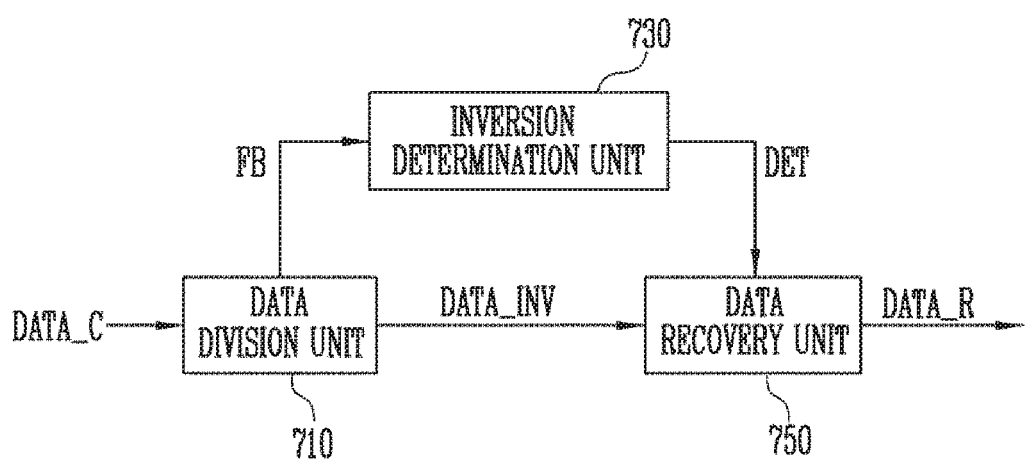
FIG. 17A is a block diagram illustrating an exemplary embodiment of a third converter of FIG. 16.
Figure 17B:
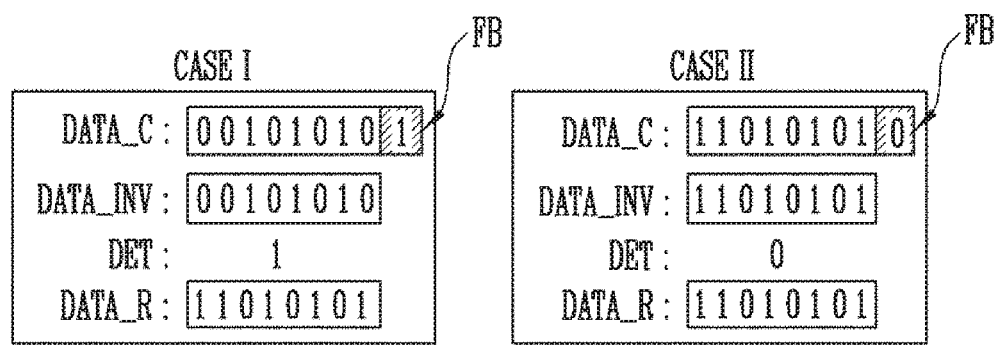
FIG. 17B is a diagram schematically illustrating an example of data conversion by a third converter.

FIG. 17A is a block diagram illustrating an exemplary embodiment of the third converter 610 shown in FIG. 16. FIG. 17B is a diagram schematically illustrating data conversion by the third converter 610. Hereinafter, operations of the third converter 610 will be described with reference to FIGS. 17A and 17B.

Referring to FIG. 17A, the third converter 610 may include a data division unit 710, an inversion determination unit 730, and a data recovery unit 750.

The data division unit 710 may divide the conversion data DATA_C read from the semiconductor memory device 100 into the intermediate data DATA_INV and the flag bit FB. The flag bit FB may be transferred to the inversion determination unit 730. The intermediate data DATA_INV may be transferred to the data recovery unit 750. The inversion determination unit 730 may generate the determination result DET indicating whether or not to invert the intermediate data DATA_INV on the basis of the value of the flag bit FB. The determination result DET may be transferred to the data recovery unit 750. The data recovery unit 750 may invert the intermediate data DATA_INV and output the inverted intermediate data DATA_INV as the random data DATA_R, or may directly output the intermediate data DATA_INV as the random data DATA_R. The output random data DATA_R may be transferred to the fourth converter 630.

FIG. 17B illustrates examples of operations of the third converter 610 for two cases. In the first case (CASE I), the conversion data DATA_C from the semiconductor memory device 100 may include bits of '001010101'. The data division unit 710 may transfer the last bit of the received data as the flag bit FB to the inversion determination unit 730 and may transfer the remaining bits '00101010' as the intermediate data DATA_INV to the data recovery unit 750. As for the second case (CASE II), the conversion data DATA_C from the semiconductor memory device 100 may include bits of '110101010'. The data division unit 710 may transfer the last bit of the received data as the flag bit FB to the inversion determination unit 730 and may transfer the remaining bits '11010101' as the intermediate data DATA_INV to the data recovery unit 750.

The inversion determination unit 730 may output the determination result DET according to the flag bit FB. For example, when the flag bit FB has a bit value '1', the inversion determination unit 730 may output the determination result DET having a value of '1' to the data recovery unit 750. When the flag bit FB has a bit value of '0', the inversion determination unit 730 may output the determination result DET having a value of '0' to the data recovery unit 750.

The data recovery unit 750 may convert and output the intermediate data DATA_INV as the random data DATA_R according to the determination result DET. As for the first case (CASE I), since the determination result DET has a value of '1', the data recovery unit 740 may invert the bits of '00101010' which are included in the intermediate data DATA_INV and may output the inverted intermediate data DATA_INV as the random data DATA_R. As for the second case (CASE II), since the determination result DET has a value of '0', the data recovery unit 740 may directly output bits of '11010101' which are included in the intermediate data DATA_INV as the random data DATA_R.

Figure 18:
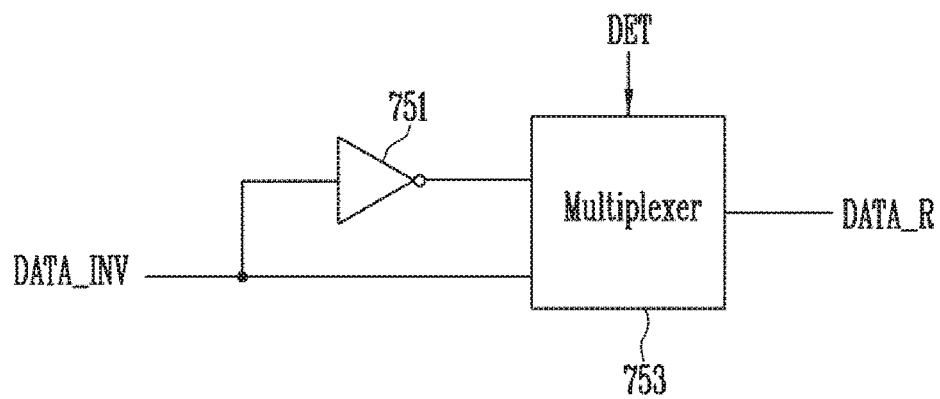
FIG. 18 is a block diagram illustrating an exemplary embodiment of a data recovery unit of FIG. 17A.

FIG. 18 is a block diagram illustrating an exemplary embodiment of the data recovery unit 750 shown in FIG. 17A.

Referring to FIG. 18, the data recovery unit 750 may include an inverter 751 and a multiplexer 753. The multiplexer 753 may receive the intermediate data DATA_INV and the inverted intermediate data as an input. In addition, the multiplexer 753 may receive the determination result DET as a control signal. When the determination result DET has a value of '0', the multiplexer 753 may select and output the intermediate data DATA_INV as the random data DATA_R. When the determination result DET has a value of '1', the multiplexer 753 may select and output the inverted intermediate data from the inverter 751 as the random data DATA_R. As shown in FIG. 18, the data recovery unit 750 may selectively output one of the intermediate data DATA_INV and the inverted intermediate data according to the determination result DET. The output data may be transferred to the fourth converter 630 as the random data DATA_R. As described above, the fourth converter 630 may derandomize and output the random data DATA_R to the host 300.

The above descriptions with reference to FIGS. 7 to 11 may show that the original data DATA is converted into the conversion data DATA_C. The conversion data DATA_C refers to data having improved distribution characteristics in both row and column directions. Therefore, a threshold voltage distribution of the memory cells in the memory cell array 110 may be improved, and reliability of the data stored in the memory cells may be improved. The descriptions with reference to FIGS. 16 to 18 may show that conversion data DATA_C is recovered to the original data DATA using the flag bit. During the read operation, the reference data Ref_DATA may not be used for data recovery.

Figure 19:
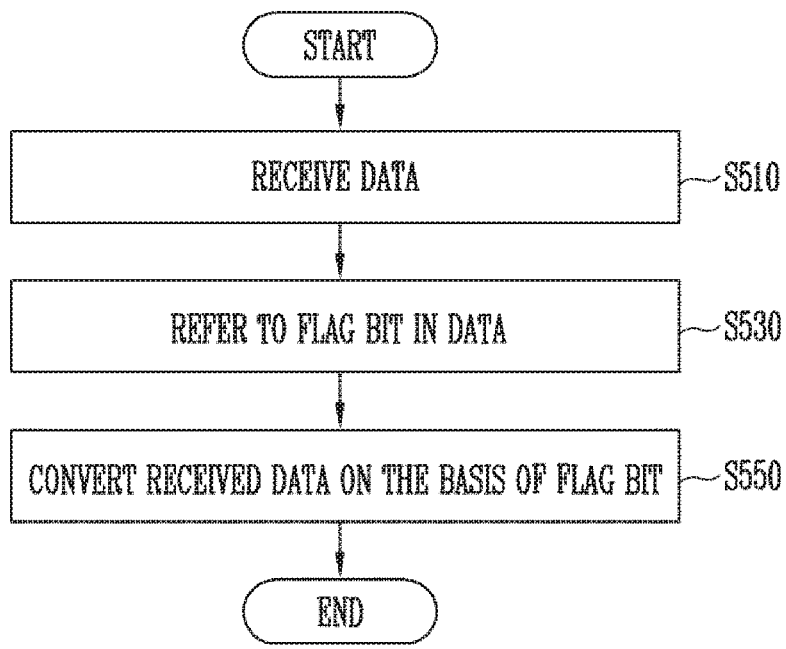
FIG. 19 is a flowchart illustrating an operating method of a memory controller in accordance with an embodiment.

FIG. 19 is a flowchart of an operating method of the memory controller 200 in accordance with an embodiment. Referring to FIG. 19, a method of operating the memory controller 200 may include receiving data from the semiconductor memory device 100 at step S510, referring to a flag bit in the received data at step S530, and converting the received data based on the flag bit at step S550. Through the steps described with reference to FIG. 19, the conversion data stored in the semiconductor memory device 100 may be recovered and provided to the host 300.

At step S510, data may be received from the semiconductor memory device 100. The received data may be the conversion data DATA_C described with reference to FIGS. 7 to 10B. The conversion data DATA_C stored in the semiconductor memory device 100 may be read from the semiconductor memory device 100 to the memory controller 200 in response to the request of the host 300.

At step S530, the flag bit FB in the received data may be referred to. For example, when the flag bit FB has a bit value of '1', the intermediate data DATA_INV in the conversion data DATA_C may be the inverted random data DATA_R. When the flag bit FB has a bit value of '0', the intermediate data DATA_INV in the conversion data DATA_C may be non-inverted random data DATA_R.

At step S550, the received intermediate data DATA_INV may be converted based on the flag bit FB. Step S550 will be described in more detail with reference to FIG. 20.

Figure 20:
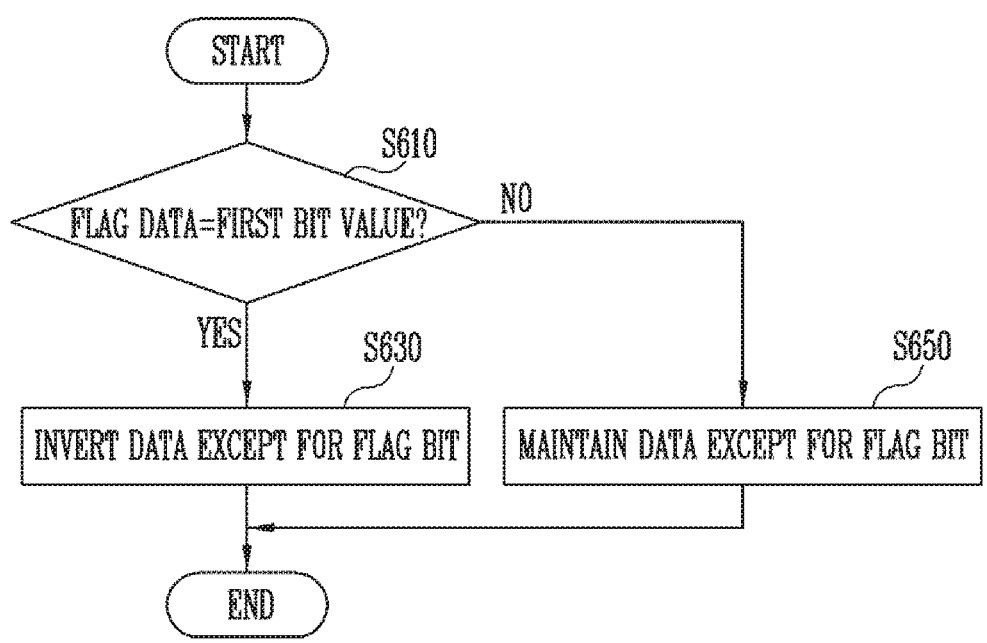
FIG. 20 is a flowchart illustrating a conversion operation of received data as shown in FIG. 19.

FIG. 20 is a detailed flowchart illustrating conversion of received data as shown in FIG. 19. Referring to FIG. 20, it may be determined whether flag data included in the flag bit FB included in the received data indicates a first bit value. For example, the first bit value may have a value of '1'. When the flag data is '1', the intermediate data DATA_INV included in the conversion data DATA_C may be inverted. For example, in the first case (CASE I) shown in FIG. 17B, bits of intermediate data DATA INV '00101010' in the received conversion data DATA_C may be inverted to generate '1101010101'.

When the flag data is '0', the intermediate data DATA_INV may be maintained. For example, in the second case (CASE II) shown in FIG. 17B, the intermediate data DATA_INV '11010101' in the received conversion data DATA_C may be maintained.

Though not shown in FIGS. 19 and 20, a method of operating the memory controller 200 in accordance with an embodiment may further include derandomizing the converted data after step S550 in which the received conversion data DATA_C is reverse-converted into the random data DATA_R. The derandomizing operation may be performed to the random data DATA_R by the fourth converter 630 shown in FIG. 16.

As described above, according to the memory controller 200 and an operating method thereof in accordance with embodiments of the invention, data randomized in a row direction (i.e., the random data DATA_R) may be compared against data (i.e., the intermediate data DATA_INV) previously programmed into a neighboring physical page, and the random data DATA_R may be inverted or maintained into the conversion data DATA_C according to the comparison result. Therefore, distribution characteristics in a column direction may be improved, a threshold voltage distribution of memory cells in the memory cell array 110 may be improved, and reliability of data stored in the memory cells may be improved.

FIG. 21 is a block diagram illustrating an embodiment (1000) of the memory system 10 shown in FIG. 1.

Referring to FIG. 21, the memory system 1000 may Include the semiconductor memory device 100 and a memory controller 1100. The semiconductor memory device 100 may be the semiconductor memory device 100 described with reference to FIG. 1. Hereinafter, repetitive explanations will be omitted.

The memory controller 1100 may be coupled to a host and the semiconductor memory device 100. The memory controller 1100 may correspond to the memory controller 200 of FIG. 1. The memory controller 1100 may be configured to access the semiconductor memory device 100 at the request of the host. For example, the memory controller 1100 may control a read operation, a program operation, an erase operation, and/or a background operation of the semiconductor memory device 100. The memory controller 1100 may be configured to provide an interface between the semiconductor memory device 100 and the host. The memory controller 1100 may be configured to drive firmware for controlling the semiconductor memory device 100.

The memory controller 1100 may include a random-access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host, and a buffer memory between the semiconductor memory device 100 and the host. The processing unit 1120 may control general operations of the memory controller 1100. In addition, the memory controller 1100 may temporarily store program data provided from the host during a write operation.

The host interface 1130 may include a protocol for exchanging data between the host and the memory controller 1100. In accordance with an exemplary embodiment, the memory controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface includes a NAND interface or a NOR interface.

The error correction block 1150 uses an error correcting code (ECC) to detect and correct an error in data received from the semiconductor memory device 100. The processing unit 1120 may control a read voltage according to an error detection result of the error correction block 1150 and control the semiconductor memory device 100 to perform re-read. In accordance with an exemplary embodiment, the error correction block 1150 may be provided as one of the components of the memory controller 1100.

The memory controller 1100 and the semiconductor memory device 100 may be integrated into a single semiconductor device. In an exemplary embodiment, the memory controller 1100 and the semiconductor memory device 100 may be integrated into one semiconductor device, to constitute a memory card. For example, the memory controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMC-micro), an SD card (SD, miniSD, microSD, or SDHC), a universal flash storage (UFS), and the like.

The memory controller 1100 and the semiconductor memory device 100 may be integrated into a single semiconductor device to form a solid-state drive (SSD). The solid-state drive (SSD) may include a storage device configured to store data in a semiconductor memory. When the memory system 1000 is used as a semiconductor drive (SSD), an operating speed of the host coupled to the memory system 2000 may be significantly increased.

In an example, the memory system 1000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an exemplary embodiment, the semiconductor memory device 100 or the memory system 1000 may be embedded in packages in various forms. For example, the semiconductor memory device 100 or the memory system 1000 may be embedded in packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP), a wafer-level processed stack package (WSP), or the like.

FIG. 22 is a block diagram illustrating an application example (2000) of the memory system 1100 shown in FIG. 21.

Referring to FIG. 22, the memory system 2000 may include a semiconductor memory device 2100 and a memory controller 2200. The semiconductor memory device 2100 may include a plurality of semiconductor memory chips. The plurality of semiconductor memory chips may be divided into a plurality of groups.

FIG. 22 illustrates the plurality of groups communicating with the memory controller 2200 through first to kth channels CH1 to CHk. Each of the semiconductor memory chips may be configured and operated in substantially the same manner as the semiconductor memory device 100 described above with reference to FIG. 1.

Each group may be configured to communicate with the memory controller 2200 through a single common channel. The memory controller 2200 may be configured in substantially the same manner as the memory controller 1100 described with reference to FIG. 21, and may be configured to control the plurality of memory chips of the semiconductor memory device 2100 through the plurality of first to kth channels CH1 to CHk.

Figure 23:
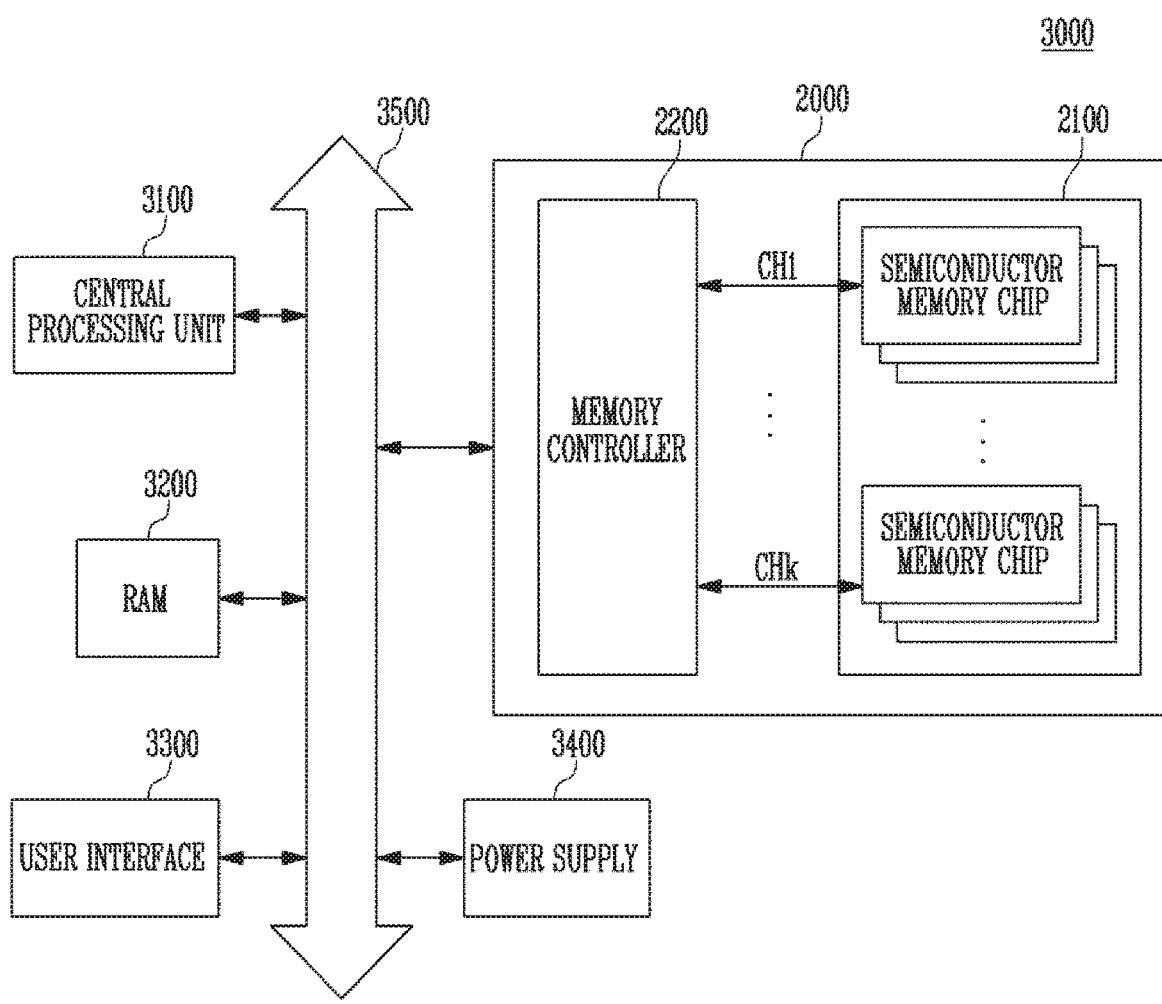
FIG. 23 is a block diagram illustrating a computing system including a memory system described with reference to FIG. 22 in accordance with an embodiment.

FIG. 23 is a block diagram illustrating a computing system 3000 including the memory system 2000 described with reference to FIG. 22.

The computing system 3000 may include a central processing unit 3100, a random-access memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data provided through the user interface 3300 or data processed by the central processing unit 3100 may be stored in the memory system 2000.

FIG. 23 illustrates that the semiconductor memory device 2100 is coupled to the system bus 3500 through the memory controller 2200. However, the semiconductor memory device 2100 may be directly coupled to the system bus 3500. The functions of the memory controller 2200 may be performed by the central processing unit 3100 and the RAM 3200.

FIG. 23 illustrates that the memory system 2000 described above with reference to FIG. 22 is provided. However, the memory system 2000 may be replaced with the memory system 1000 described with reference to FIG. 21. As an exemplary embodiment, the computing system 3000 may be configured to include both memory systems 1000 and 2000 described with reference to FIGS. 21 and 22.

In accordance with an embodiment, a memory controller having improved performance and an operating method thereof may be provided.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

What is claimed is:

1. A memory controller controlling an operation of a semiconductor memory device including a plurality of memory cells at a request of a host, comprising:
   a data conversion unit,
   wherein the data conversion unit converts first data from the host by comparing the first data with second data programmed previously, and
   wherein the data conversion unit comprises:
      a first converter generating random data by randomizing the first data; and
      a second converter generating conversion data by comparing the random data with the second data.

2. The memory controller of claim 1, wherein the second data is programmed into a second physical page located adjacent to a first physical page to be programmed with the first data.

3. The memory controller of claim 1, wherein the second converter comprises:
   a reference data buffer storing the second data;
   a conversion determiner determining whether to convert the random data by comparing the second data with the random data; and
   a conversion operator generating the conversion data by processing the random data based on a determination result of the conversion determiner.

4. The memory controller of claim 3, wherein the conversion determiner comprises:
   an XOR operation unit performing an exclusive OR (XOR) operation of the second data and the random data to generate XOR operation data; and
   a result comparison unit determining whether to convert the random data based on a number of zero bits included in the XOR operation data.

5. The memory controller of claim 4, wherein the result comparison unit determines to convert the random data when the number of zero bits included in the XOR operation data is greater than a predetermined threshold value, and the result comparison unit determines not to convert the random data when the number of zero bits included in the XOR operation data is equal to or less than the predetermined threshold value.

6. The memory controller of claim 4, wherein the conversion operator comprises:
   a data inversion unit inverting the random data to generate intermediate data based on a determination result of the result comparison unit; and
   a flag padding unit generating the conversion data by adding a flag bit to the intermediate data.

7. The memory controller of claim 6, wherein the data inversion unit comprises:
   an inverter inverting the random data to output inverted random data; and
   a multiplexer receiving the random data and the inverted random data and outputting one of the random data and the inverted random data as the intermediate data based on the determination result of the result comparison unit.

8. A memory controller controlling an operation of a semiconductor memory device including a plurality of memory cells at a request of a host, comprising:
   a data conversion unit,
   wherein the data conversion unit generates second data by recovering first data from the semiconductor memory device based on a flag bit included in the first data, and
   wherein the data conversion unit comprises:
      a first converter generating random data based on the flag bit of the first data; and
      a second converter generating the second data by derandomizing the random data.

9. The memory controller of claim 8, wherein the first converter comprises:
   a data division unit dividing the first data to generate the flag bit and intermediate data;
   an inversion determination unit determining whether to invert the intermediate data based on a value of the flag bit; and
   a data recovery unit generating the random data from the intermediate data based on a determination result of the inversion determination unit.

10. The memory controller of claim 9, wherein the inversion determination unit determines to invert the intermediate data when the flag bit has a first bit value, and the inversion determination unit determines to maintain the intermediate data when the flag bit has a second bit value.

11. The memory controller of claim 10, wherein the data recovery unit comprises:
   an inverter inverting the intermediate data to output inverted intermediate data; and
   a multiplexer receiving the intermediate data and the inverted intermediate data and outputting one of the intermediate data and the inverted intermediate data as the random data based on the determination result of the inversion determination unit.

12. A method of operating a memory controller controlling a semiconductor memory device, the method comprising:
   receiving first data from a host;
   determining whether to invert the first data by comparing the first data with second data previously programmed into the semiconductor memory device; and converting the first data based on a determination result,
wherein the first data is completely randomized, and the second data is programmed into a second physical page adjacent to a first physical page to be programmed with the first data.

13. The method of claim 12, wherein the determining of whether or not to invert the first data comprises:
    performing an exclusive OR (XOR) operation of the first data and the second data to generate XOR operation data;
    comparing a number of zero bits included in the XOR operation data with a predetermined threshold value; and
    converting the first data based on a comparison result.

14. The method of claim 13, wherein the converting of the first data based on the comparison result comprises:
    determining to invert the first data when the number of zero bits included in the XOR operation data is greater than the predetermined threshold value, and
    determining to maintain the first data when the number of zero bits included in the XOR operation data is equal to or less than the predetermined threshold value.

15. The method of claim 14, wherein the converting of the first data when the number of zero bits included in the XOR operation data is greater than the predetermined threshold value comprises:
    performing an inverting operation of the first data; and
    padding the first data with a first bit value.

16. The method of claim 15, wherein the converting of the first data when the number of zero bits included in the XOR operation data is equal to or less than the predetermined threshold value comprises:
    padding the first data with a second bit value.

17. A method of operating a memory controller controlling a semiconductor memory device, the method comprising:
    receiving first data from the semiconductor memory device;
    referring to a flag bit in the first data; and
    generating second data by converting the first data based on the flag bit,
    wherein the converting of the first data based on the flag bit comprises:
        generating the second data by inverting data except for the flag bit in the first data when the flag bit is a first bit value, and
        generating the data except for the flag bit in the first data as the second data when the flag bit is a second hit value different from the first bit value.

18. The method of claim 17, further comprising derandomizing the second data after generating the second data.

19. A memory system comprising:
    a memory device including a memory cell array coupled to word lines and bit lines respectively in row and column directions; and
    a controller configured to:
    generate randomized data by randomizing original data;
    generate currently converted data by selectively inverting the randomized data based on bit-similarity between the randomized data and previously converted data stored in the memory cell array coupled to one or more adjacent word lines;
    generate a flag bit indicating the currently converted data as one between inverted and non-inverted versions of the randomized data; and
    control the memory device to store the currently converted data and the flag bit into the memory cell array on a word line basis.

20. The memory system of claim 19, wherein the controller is further configured to:
    control the memory device to read-out the currently converted data and the flag bit from the memory cell array on the word line basis;
    recover the randomized data by selectively inverting the read-out converted data according to the flag bit; and
    recover the original data by derandomizing the recovered randomized data.

* * * * *